US006686226B1

(12) United States Patent
Tsunoda et al.

(10) Patent No.: US 6,686,226 B1
(45) Date of Patent: Feb. 3, 2004

(54) METHOD OF MANUFACTURING A SEMICONDUCTOR DEVICE A BALL GRID ARRAY PACKAGE STRUCTURE USING A SUPPORTING FRAME

(75) Inventors: Shigeharu Tsunoda, Fujisawa (JP); Junichi Saeki, Yokohama (JP); Isamu Yoshida, Yokohama (JP); Kazuya Ooji, Kamakura (JP); Michiharu Honda, Yokohama (JP); Makoto Kitano, Tsuchiura (JP); Nae Yoneda, Ibaraki-ken (JP); Shuji Eguchi, Ibaraki-ken (JP); Kunihiko Nishi, Kokubunji (JP); Ichiro Anjoh, Koganei (JP); Kenichi Otsuka, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/562,758

(22) Filed: May 2, 2000

Related U.S. Application Data

(63) Continuation of application No. 09/114,997, filed on Jul. 14, 1998, now Pat. No. 6,114,192, which is a division of application No. 08/805,737, filed on Feb. 25, 1997, now Pat. No. 5,914,531, which is a continuation of application No. 08/382,276, filed on Feb. 1, 1995, now abandoned.

(30) Foreign Application Priority Data

Feb. 10, 1994 (JP) .............................. 6-016105

(51) Int. Cl.⁷ .............................................. H01L 21/44

(52) U.S. Cl. ...................... 438/123; 257/666; 257/672; 257/734

(58) Field of Search ................................ 438/112, 123, 438/257, 256, 258, 124, 763; 257/706, 720, 712, 787, 676, 723; 264/272.17; 361/714, 718

(56) References Cited

U.S. PATENT DOCUMENTS

| 4,099,200 A | * | 7/1978 | Koutalides ............... 174/50.61 |
| 4,864,383 A | * | 9/1989 | Gloton et al. ............... 257/679 |
| 4,891,687 A | | 1/1990 | Mallik et al. |
| 4,899,207 A | | 2/1990 | Hallowell et al. |
| 5,053,855 A | | 10/1991 | Michii et al. |
| 5,148,265 A | | 9/1992 | Khandros et al. |

(List continued on next page.)

FOREIGN PATENT DOCUMENTS

| EP | 0 595 300 | 5/1994 |
| JP | 61-46049 | 10/1986 |
| JP | 61-222151 | 10/1986 |
| JP | 62-277753 | 2/1987 |
| JP | 2-309660 | 12/1990 |
| JP | 04-184944 | 7/1992 |
| JP | 05-129391 | 5/1993 |
| TW | 230273 | 9/1994 |
| TW | 230274 | 9/1994 |

OTHER PUBLICATIONS

Jim Slolan, The First VLSI Packaging Workshop of Japan Nov. 30, 1992, pp. 17–27.*

Primary Examiner—Olik Chaudhuri
Assistant Examiner—Nathan W. Ha
(74) Attorney, Agent, or Firm—Mattingly, Stanger & Malur, P.C.

(57) ABSTRACT

A semiconductor plastic package, more particularly a preferred package structure and method for making a BGA package. A resin sealed BGA package where a supporting frame which fixedly supports semiconductor parts; i.e., an IC chip, a circuit board, or a circuit film, is sealed with resin, using a mold, which is composed of an upper mold half and a lower mold half with the lower mold half having a plurality of projections, one at a position corresponding to each of the external terminals. The mold has a divisional structure which has an air vent between the divisional elements thereof.

22 Claims, 41 Drawing Sheets

U.S. PATENT DOCUMENTS

| | | | | |
|---|---|---|---|---|
| 5,157,475 A | * | 10/1992 | Yamaguchi | 257/679 |
| 5,200,362 A | * | 4/1993 | Lin | 437/207 |
| 5,216,278 A | | 6/1993 | Lin et al. | |
| 5,218,759 A | * | 6/1993 | Juskey | 29/840 |
| 5,239,198 A | * | 8/1993 | Lin | 257/693 |
| 5,241,133 A | * | 8/1993 | Mullen, III | 257/678 |
| 5,256,903 A | * | 10/1993 | Obata | 257/787 |
| 5,293,072 A | | 3/1994 | Tsuji et al. | |
| 5,294,827 A | | 3/1994 | McShane | |
| 5,304,843 A | * | 4/1994 | Takubo | 257/670 |
| 5,332,864 A | | 7/1994 | Liang et al. | |
| 5,358,904 A | | 10/1994 | Murakami et al. | |
| 5,365,106 A | | 11/1994 | Watanabe | |
| 5,378,924 A | * | 1/1995 | Liang | 257/675 |
| 5,391,916 A | | 2/1995 | Kohno et al. | |
| 5,490,324 A | | 2/1996 | Newman | |
| 5,639,695 A | | 6/1997 | Jones et al. | |
| 5,650,593 A | * | 7/1997 | McMillan | 29/827 |
| 5,693,572 A | | 12/1997 | Bond et al. | |
| 5,827,999 A | * | 10/1998 | McMillan | 257/704 |
| 5,914,531 A | | 6/1999 | Tsunoda et al. | |

* cited by examiner

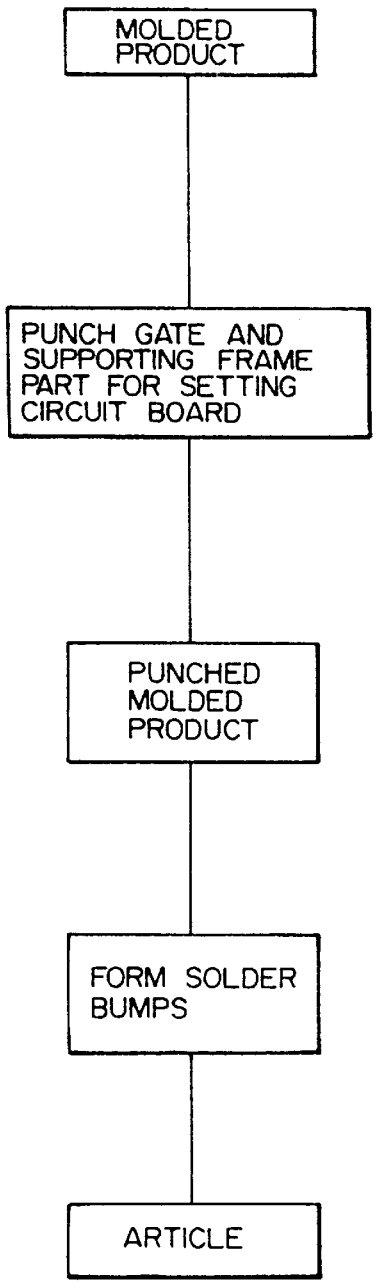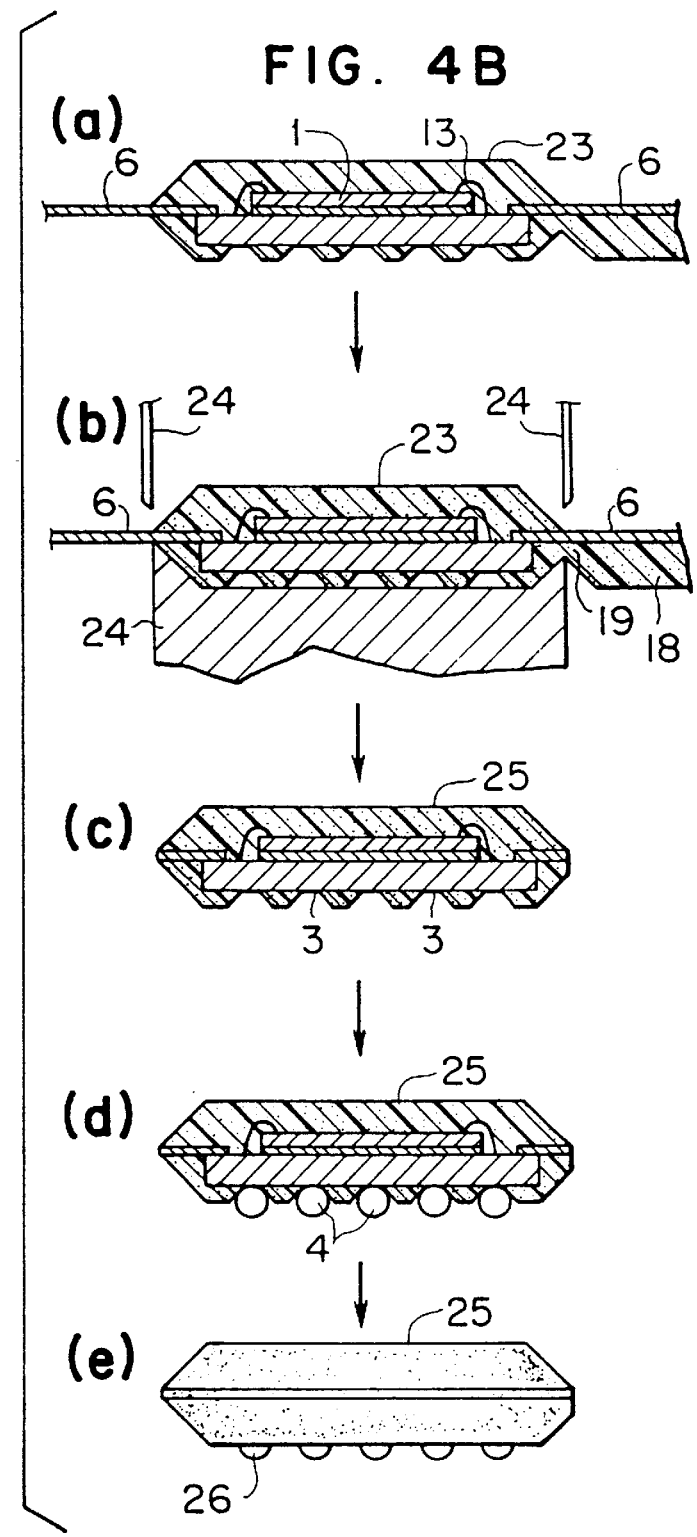

FIG. 48
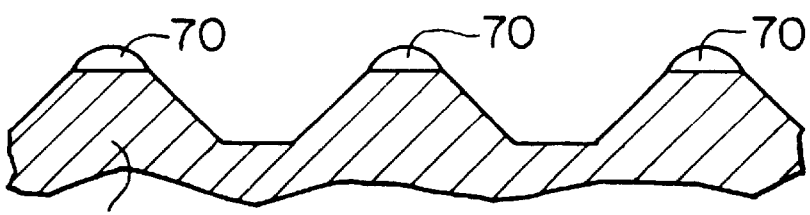
(a)
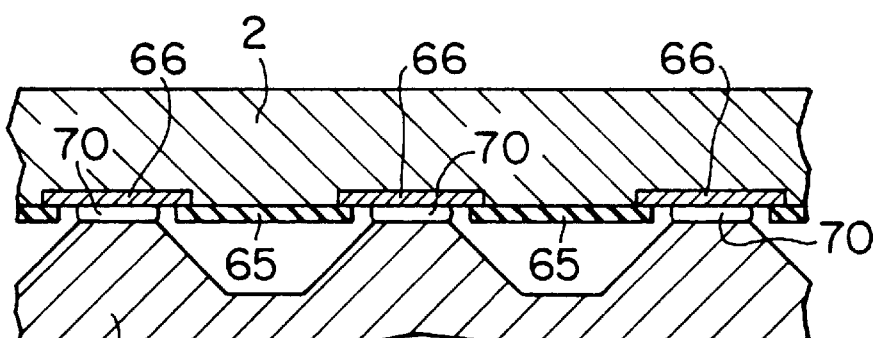
(b)
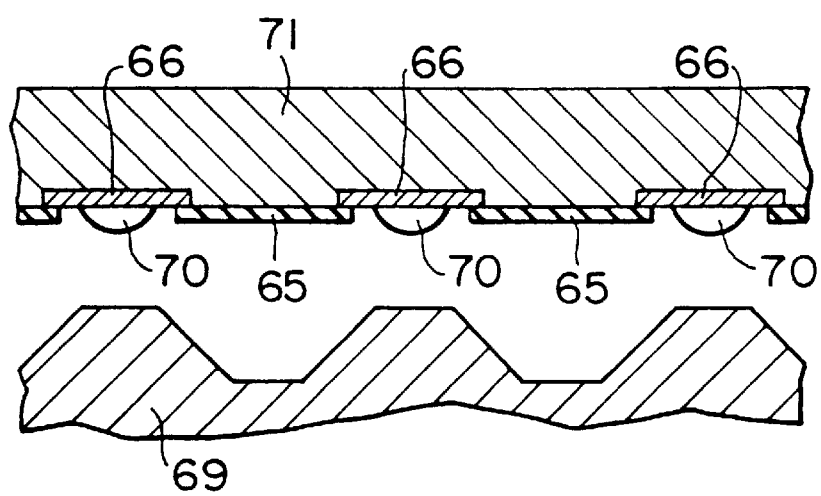
(c)

FIG. 50
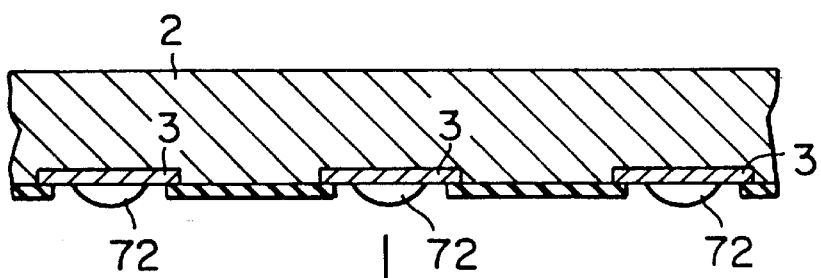
(a)
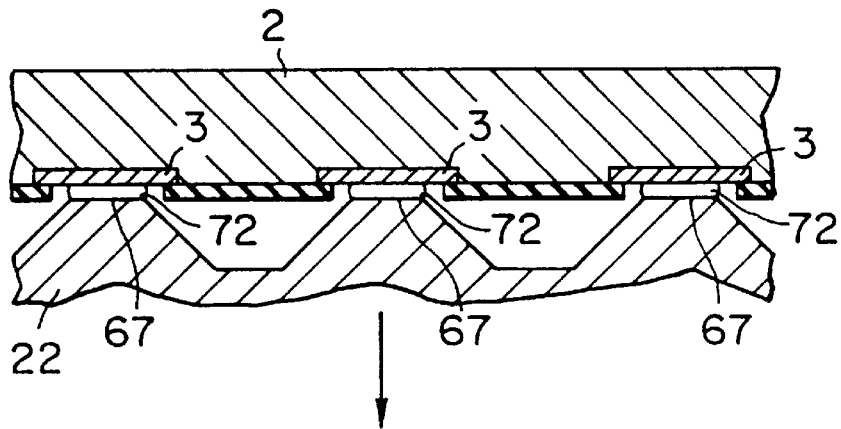
(b)
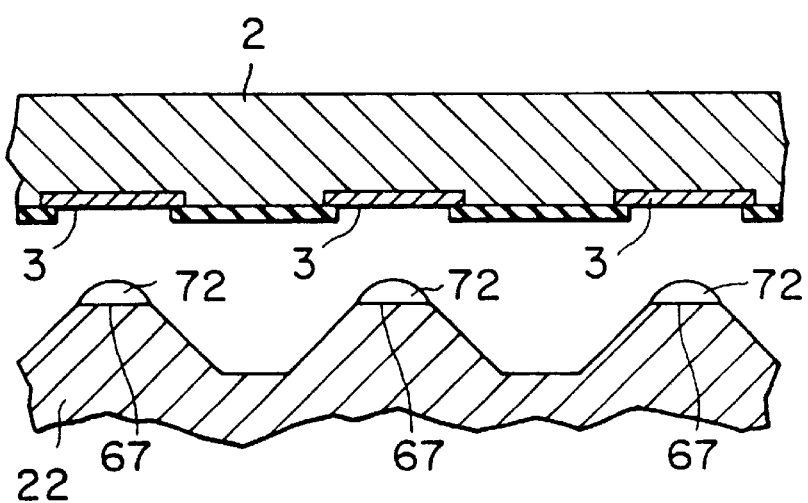
(c)

FIG. 51
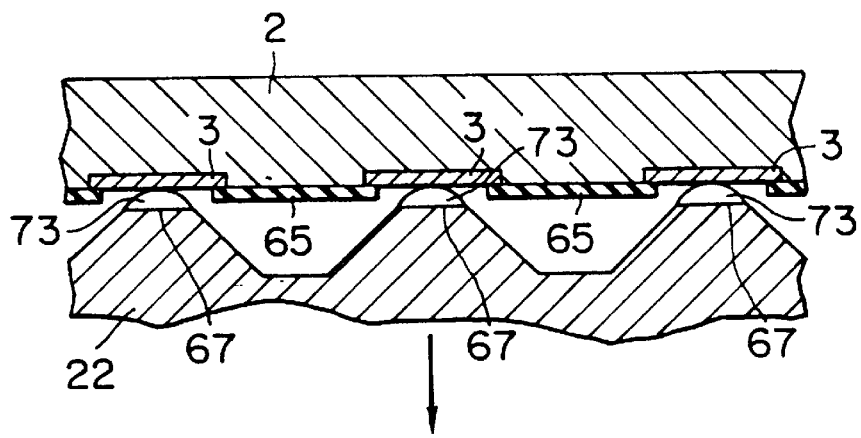
(a)
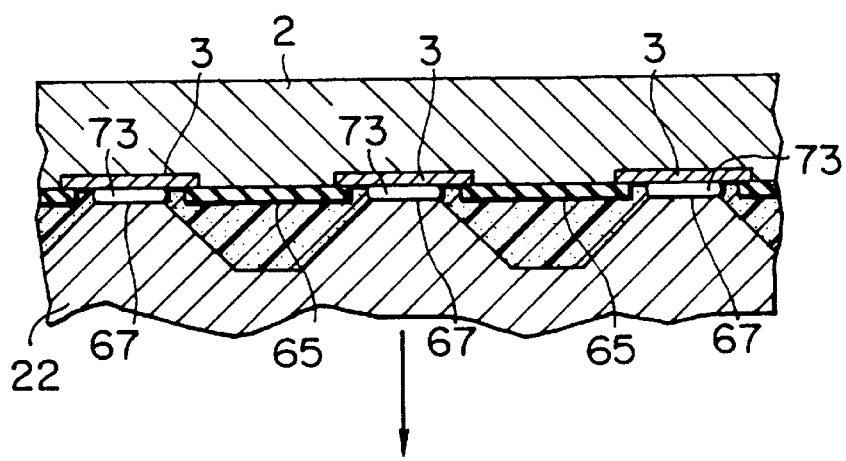
(b)
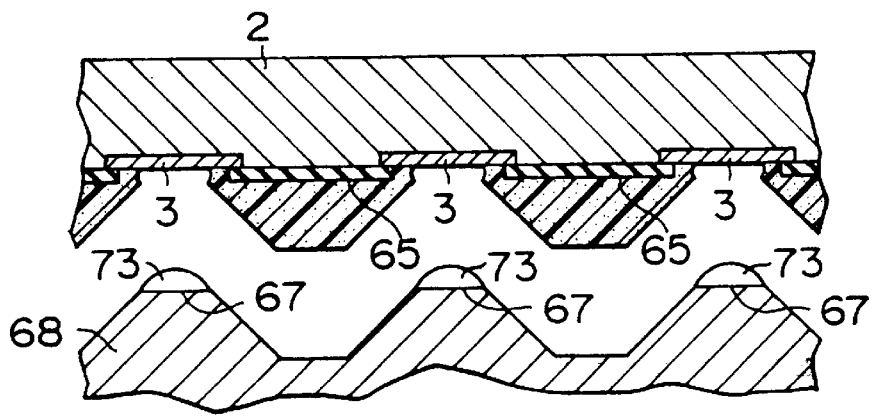
(c)

METHOD OF MANUFACTURING A SEMICONDUCTOR DEVICE A BALL GRID ARRAY PACKAGE STRUCTURE USING A SUPPORTING FRAME

This is a continuation application of U.S. Ser. No. 09/114,997, filed Jul. 14, 1998, now U.S. Pat. No. 6,114,192 which is a divisional application of U.S. Ser. No. 08/805,737, filed Feb. 25, 1997, now U.S. Pat. No. 5,914,531, which is a continuation application of U.S. Ser. No. 08/382,276, filed Feb. 1, 1995, now abandoned.

BACKGROUND OF THE INVENTION

The present invention relates to plastic package semiconductor devices and methods of making the devices, and more particularly to a ball grid array (BGA) package semiconductor device, a method of fixing and supporting the components of the device and a method of making the device.

Semiconductor package structures have advanced toward miniaturization and thinning to increase the density of components packaged therein. The quantity of information to be processed by one chip tends to increase. The number of input/output pins per package tends to increase. Since the size of the package cannot increase as much as one desires, however, the spacing between any adjacent lead pins tends to decrease greatly as the number of lead pins increases. Thus, the current situation is that a high technique is required for mounting devices on a circuit board or substrate. In order to facilitate the mounting of devices, packages have appeared having an external connection structure such as a pin grid array (PGA) and a BGA which are different in external connection form from the conventional ones. A face up type BGA package is disclosed in U.S. Pat. No. 5,216,278. A face down type is disclosed in U.S. Pat. No. 5,148,265.

The BGA structure similar to one disclosed in U.S. Pat. No. 5,216,278, for example, will next be outlined as an example of the face up type with reference to FIGS. 38–40.

FIG. 38 is a cross-sectional view of an BGA package. An IC chip 1 is bonded to a circuit board 2 by means of an adhesive or the like. The board 2 is made of an organic material such as a BT resin. The IC chip 1 is connected electrically by bonding wires 13 to pads 12 on the board 2.

FIG. 39 is a top plan view of the PkG package of FIG. 38. Wiring patterns each extending from a pad 12 on the board 2 are disposed on the board 2 to communicate with a terminal 3 on the back of the board 2.

FIG. 40 is a bottom view of the package of FIG. 38. The terminals 3 are disposed at crossing points of a grid and electrical wiring is completed by joining metal bumps 4 to the corresponding terminals 3. A protective package is finished by covering with resin 14 that surface of the board on which the IC chip 1 which is a constituent component is provided.

A plurality of cavities each for a BGA package are usually disposed within a mold and filled with resin in the molding process in view of productivity. Therefore, the BGA packages are difficult to position within the mold in such arrangement and a molded product removal process is very complicated. This increases the manufacturing cost.

A face down type BGA package structure similar to one disposed in U.S. Pat. No. 5,148,265, for example, will be described, with respect to FIGS. 41 and 42. FIG. 41 is a perspective view of a BGA package composed of inserts 32 of silicon rubber or the like placed on a circuit side surface of an IC chip 1 and a circuit film 31 having a circuit pattern placed on the inserts 32. The IC chip 1 and the circuit film 31 are connected by bonding wires 13.

FIG. 42 is an enlarged cross-sectional view of connections of FIG. 41. The protective package is completed by covering, with an elastic resin 14, the IC chip 1 and the package excluding the areas of the terminals 33 to complete a package. In this case, there are problems similar to those with the face up type package. Since, usually, a plurality of BGA packages are disposed within a mold and filled with resin in the molding process in view of productivity, the packages are difficult to position within the mold in such arrangement and a molded product removal process is very complicated. This would increase the manufacturing cost.

In the process of molding packages each including a circuit board, the circuit board is usually placed between an upper mold half and a lower mold half and resin is filled into cavities provided over the circuit board. Therefore, a runner and a gate which compose a flow path through which resin is fed over the board are required to be provided, which is a restriction to the design of an electric circuit. In addition, this might reduce the reliability of the package because there is a possibility of the circuit board being damaged in the process of removal of the runner and gate which become unnecessary after molding.

There are many known prior art molding methods which use no runner and gate disposed on the circuit board which compose a flow path through which resin is filled onto the circuit board; for example, JP-B-61-46049 and JP-A-4-184944. JP-B-61-46049 discloses a molding process performed in an arrangement where a mold has a runner and a gate which compose a part of a flow path through which resin is fed into a cavity composed of plates (so-called "cavity plates") with the cavity and the circuit board being placed within the mold. In this process, there are no restrictions to the design of an electric circuit on the circuit board, but there is a possibility that when a thin package is to be produced, other problems will occur such as deformation of the cavity plates themselves or removal of resin burrs produced on the circuit board because the cavity plates are thin. In addition, each time molding is performed, the cavity plates are required to be replaced with new ones and hence automation of the molding process is difficult.

JP-A-4-184944 discloses a mold structure where a runner and a gate are incorporated in a mold to compose a flow path through which resin is fed into the mold. The engaged portions at the runner and gate are arranged to slide with respect to each other when the mold is opened. In this case, resin flows over the sliding parts, so that resin is likely to enter into a possible spacing between the sliding parts. Thus, resin burrs are likely to be produced to act as sliding resistance to the sliding element to thereby cause malfunction of same, undesirably. This malfunction can be a serious problem in the production of these packages.

SUMMARY OF THE INVENTION

The prior art renders difficult the positioning of the components of the package within the mold used for resin molding. In addition, it renders the molding process complicated, so that automation of the process and saving of attendants are difficult. These factors increase the manufacturing cost.

In the molding process of a package including a circuit board and other components, resin is likely to enter a possible spacing between the sliding parts in the resin flow path within the mold to become burrs to cause malfunction and hence reduce the efficiency of production. When a thin package is made in a molding process, using the arrangement in which the runner and gate which compose the flow path for resin are provided along with cavity plates and the circuit board within the mold, the cavity plates are required to be thin, so that when a thin article is to be made, the plates themselves would be deformed, undesirably. In addition, in each molding process, the cavity plates are required to be replaced with different ones to thereby render the automation of the molding process difficult, reduce the efficiency of the molding and raise the manufacturing cost.

It is an object of the present invention to provide a BGA package structure which is free from the above drawbacks, high in productivity, and reduces the manufacturing cost, and a method of making such a BGA package structure.

In one aspect of the present invention, in order to achieve the above object, there is provided a BGA package structure which uses a supporting frame which fixedly supports an IC chip, a circuit board, or a circuit film.

In another aspect, there is provided a BGA package structure in which an IC chip and a circuit board or a circuit film are covered with resin.

With the arrangement, the components of the packages are easily positioned within the mold cavities, so that in the molding process many BGA packages are fabricated without any problems. This permits the supporting frame to act as a heat radiator, to reinforce the strength of the circuit board and hence to reduce a bend in the circuit board. The IC chip, circuit board or circuit film is sealed with resin to reduce a bend of the BGA package. In addition, the use of the supporting frame facilitates the automation of the respective process steps to improve the productivity.

BRIEF DESCRIPTION OF THE DRAWINGS

FIG. 4A is a flowchart indicative of a process for finishing a molded product and FIG. 4B illustrates the process;

FIGS. 48a–48c is a flowchart indicative of a process for coating each of the surfaces of board terminals of a fifteenth embodiment of the present invention with a mold releasing agent;

FIGS. 50a–50c is a flowchart indicative of a process for coating projections of a sixteenth embodiment with thermo-setting rubber resin;

FIGS. 51a–51c is a flowchart indicative of a process for molding a board in a lower cavity half with projections each with a cured rubber resin.

DESCRIPTION OF THE PREFERRED EMBODIMENTS

Figure 1:
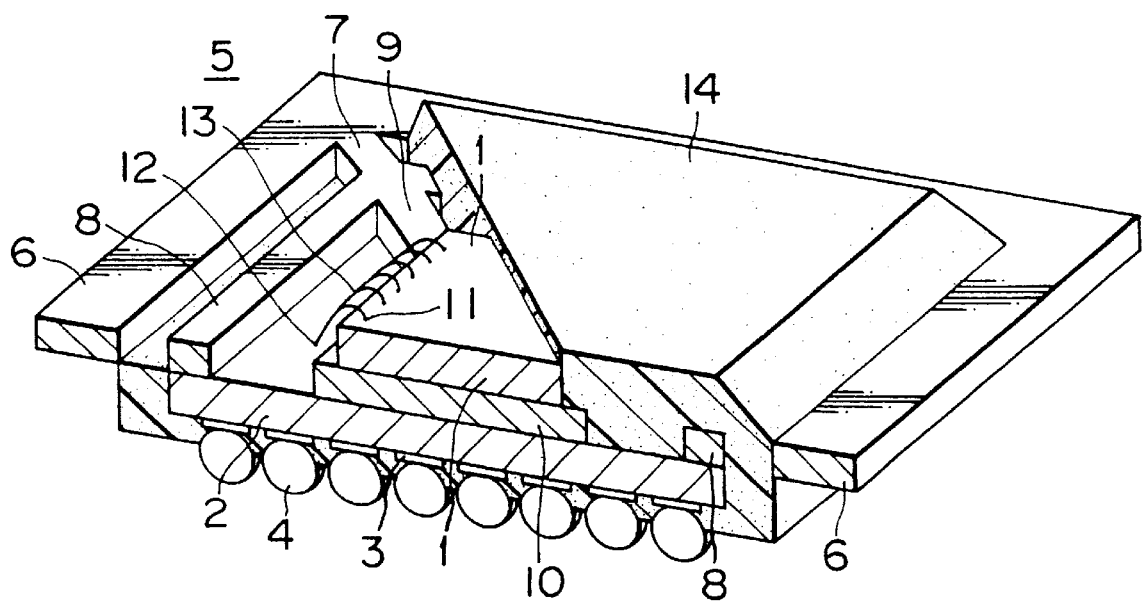
FIG. 1 is a perspective partially broken-away, cross-sectional view of a BGA package structure of a first embodiment.

Embodiments of the present invention will be described next with reference to the accompanying drawings. Like components are identified by the same reference numerals throughout all the figures and no corresponding description will be repeated.

FIG. 1 is a perspective view indicative diagrammatically of a face-up BGA package of a first embodiment. The face-up BGA package is composed of an IC chip 1, a circuit board 2 as a base member, terminals (or electrodes) 3 for external conduction provided on the component mounting side surface of the circuit board, metal bumps 4 joined to the terminals 3 to act as external terminals, and a supporting frame (i) 5 which fixes those elements. The supporting frame (i) 5 is composed of a rim (or outer rim) 6 of a lead frame, a supporting part 7 for settling the circuit board, a board settling rim 8, a tab supporting part 9 and a tab 10. (The elements 7–10 constitute a supporting part.) The IC chip 1 and the circuit board 2 are fixed by an adhesive with the tab 10 interposed therebetween. The circuit board 2 is made of an insulating material. Pads 11 on the IC chip 1 are connected electrically by wire bondings, such as gold wires 13 to wiring pads 12 on the circuit board 2. Electrical leads are disposed from the pads 12 on the board 2 via through-holes (not shown) or the like formed in the board 2 to establish electrical connection to the terminals 3 on the back of the board 2, though not shown in the figure. Those electrical leads are, of course, protected by an insulating material such as a solder resist (not shown). The electrical leads on the back side of the board 2 further extend to respective electrodes 3. The whole of those elements placed in the mold in this state excluding the terminals on the component mounting surface of the circuit board 2, is sealed with and protected by resin 14 to finish the whole package. Metal bumps, for example, solder balls are then joined to the terminals 3 to complete electrical wiring to thereby provide an article.

Figure 2A:
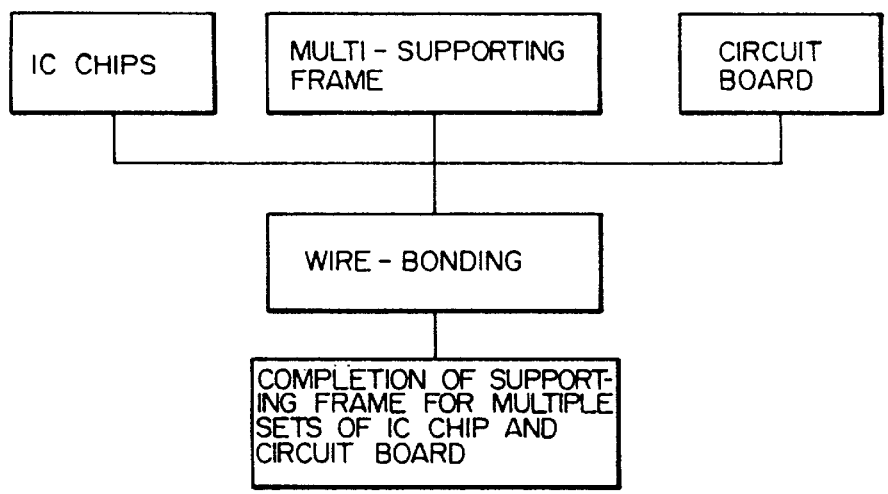
FIG. 2A is a flowchart indicative of a process for assembling a supporting lead frame and multiple sets of an IC chip and a circuit board and FIG. 2B illustrates the assembling process and the resulting package.
Figure 2B:
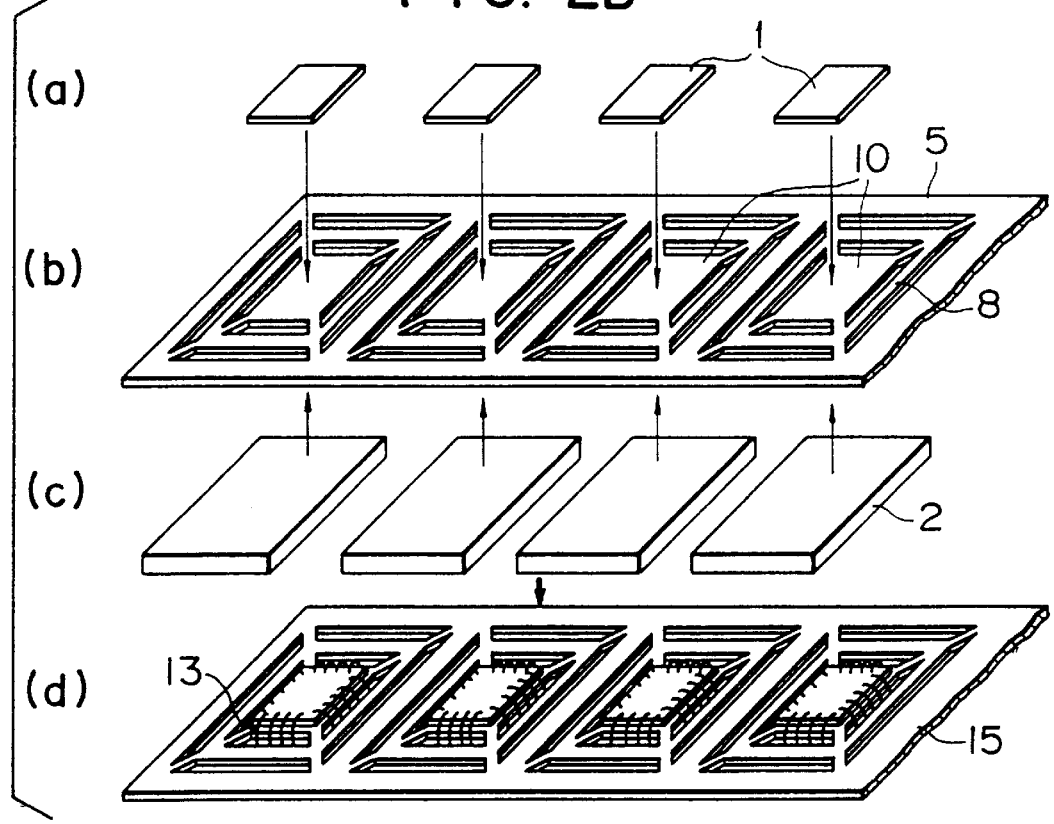

FIGS. 2–4 each outline a flowchart indicative of a manufacturing process and the process. Usually, a plurality of BGA packages are resin molded together. The manufacturing process employed in this case will be described next. FIG. 2A outlines a flowchart indicative of a process for assembling the IC chips 1, circuit boards 2 and supporting frame (i) 5 as the components, and FIG. 2B illustrates the assembling process diagrammatically. More specifically, the supporting frame (i) 5 has a multi-structure of FIG. 2B(b) which permits molding of a plurality of BGA packages at the same time. IC chips 1 (FIG. 2B(a)) are bonded with an adhesive to the respective tabs 10 on the multi-supporting frame (i) 5 (FIG. 2B(b)). The circuit boards 2 (FIG. 2B(c)) are then fixed by an adhesive from the backs of the supporting frame (i) 5 (FIG. 2B(b)) to the backs of the tabs 10 and to the circuit board settling rim 8 to thereby provide a three-layer structure having the sandwiched tabs 10. The frame (i) 5 (FIG. 2B(b)) has guide holes (not shown) in the rim thereof for performing the respective manufacturing processes automatically. Then, pads (not shown) on the IC chips 1 are bonded by gold wires 13 to the pads (not shown) on the circuit boards 2 for establishing electrical conduction to the circuit board 2 to complete a multi-supporting lead frame 15 with multiple sets of an IC chip and a circuit board assembled thereon (FIG. 2B(d)).

Figures 3A, 3B:
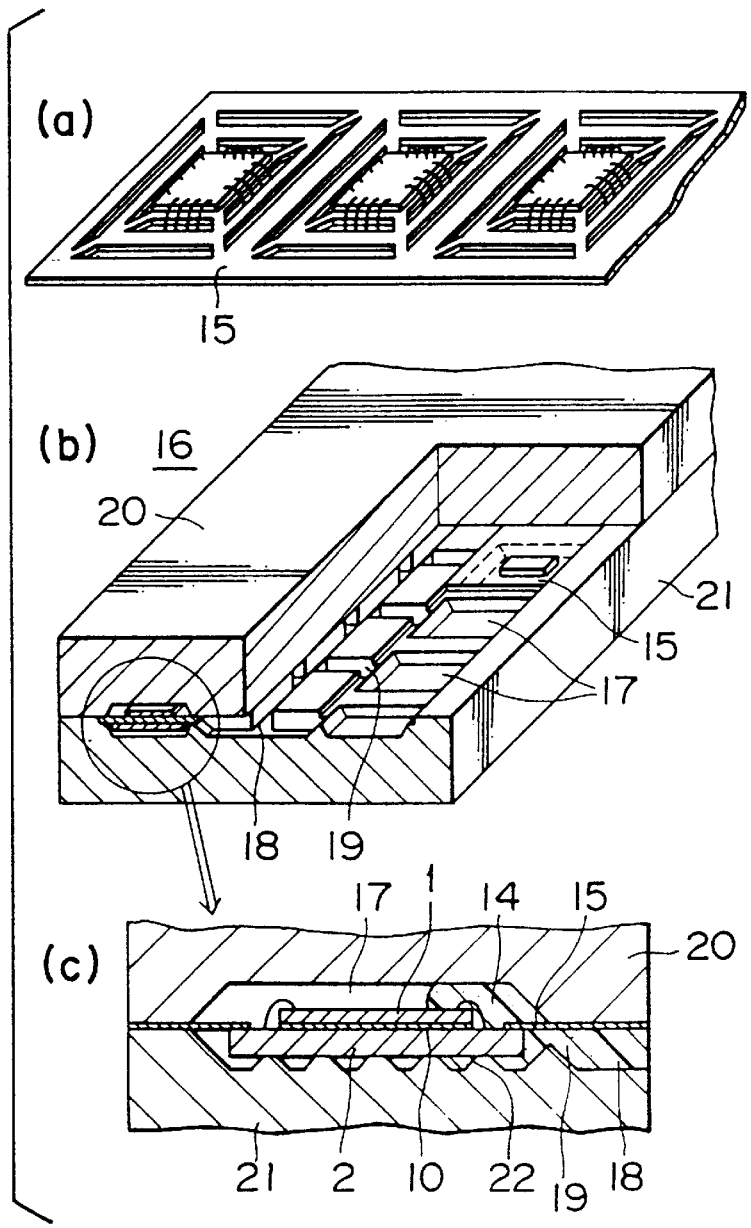
FIG. 3A is a flowchart indicative of a process for resin molding and FIG. 3B shows the process.

FIG. 3A is a flowchart indicative of a process for molding with resin a supporting lead frame 15 on which multiple sets of an IC chip and a circuit board are assembled, and FIG. 3B illustrates the process diagrammatically. Now, transfer molding with an epoxy resin which is a thermosetting resin will be described. The supporting lead frame 15 on which multiple sets of an IC chip and a circuit board are assembled (FIG. 3B(a)) is placed such that each set of an IC chip and a circuit board is placed within a corresponding cavity 17 in a mold (i) 16 (FIG. 3B(b)). At this time, the mold (i) 16 is at an elevated temperature where the epoxy resin cures. Molded resin tablets (not shown) are fed into pots (not shown) of the mold and pressed by a plunger (not shown). The pressed resin 14 is heated, melted and passed through a runner 18 and a gate 19 in the mold into the cavity 17 and cured by a curing reaction to become an article. The state within the cavity 17 will be explained with reference to an enlarged cross-sectional view 3B(c). The supporting lead frame 15 with the sets of an IC chip and a circuit board being assembled thereon is placed between an upper mold half 20 and a lower mold half 21. The tabs 10 which each mount a chip/board thereon are placed in the corresponding cavities 17. At this time, of course, each supporting lead frame 15 is positioned by the cooperation of positioning holes (not shown) in the supporting lead frame 15 with positioning pins (not shown) in the mold within the cavity 17. Under such condition, resin is fed into the cavity 17 to cover and seal with resin the assembly excluding the terminals. At this time, projections 22 provided in the cavity of the lower mold half 21 prevent feed of resin 14 onto the terminals 3 on the package surface of the circuit board 2 to complete the resin molding with the terminals 3 remaining exposed.

FIG. 4A is a flowchart indicative diagrammatically of a process for finishing a molded product to an article and FIG. 4B illustrates the process diagram-matically. The lead frame rim 6, the gate 19 and the runner 18 of the resin molded package 23 (FIG. 4B(a)) which are now useless are cut away by a punching die 24 (FIG. 4B(b)) from the resin molded package 23. The separated product 25 (FIG. 4B(c)) is then delivered to an external terminal forming process (FIG. 4B(d)), where, for example, solder balls 4 are fed to, heated at and joined to the beforehand exposed terminals 3 on the board package surface to complete the final external terminals 26 to end the whole process to thereby complete a resin-sealed BGA package (FIG. 4B(e)). The resin sealing process using the supporting lead frame 15 on which the chips/board are assembled is achieved by a conventional transfer molding technique which is currently used in general, so that the manufacturing cost is reduced and the efficiency of production is improved. The board made of an organic material is greatly protected from moisture by the resin sealing of the chips/board, so that moisture-proof reliability is greatly increased. More specifically, in a structure in which only a surface of a circuit board on which the IC chips are assembled is resin sealed, for example, as disclosed in U.S. Pat. No. 5,216,278, scaling-off of wiring leads from the chip mounting surface of the board, cracking of the board and corrosion of the wiring leads are likely to occur due to moisture from the board terminal side and hence the structure is considerably difficult to ensure moisture-proof reliability. In contrast, in the present embodiment which seals the chips/board with resin ensures the moisture-proof reliability. In the case of an article which is required to be cooled because it produces much chip heat in its operation, the heat is advantageously radiated through the tabs below the chip and the rim of the lead frame for settling the circuit board. When higher heat radiation is required, the rim 6 of the lead frame to be cut away may be used as a heat radiator without being cut away.

Figure 5:
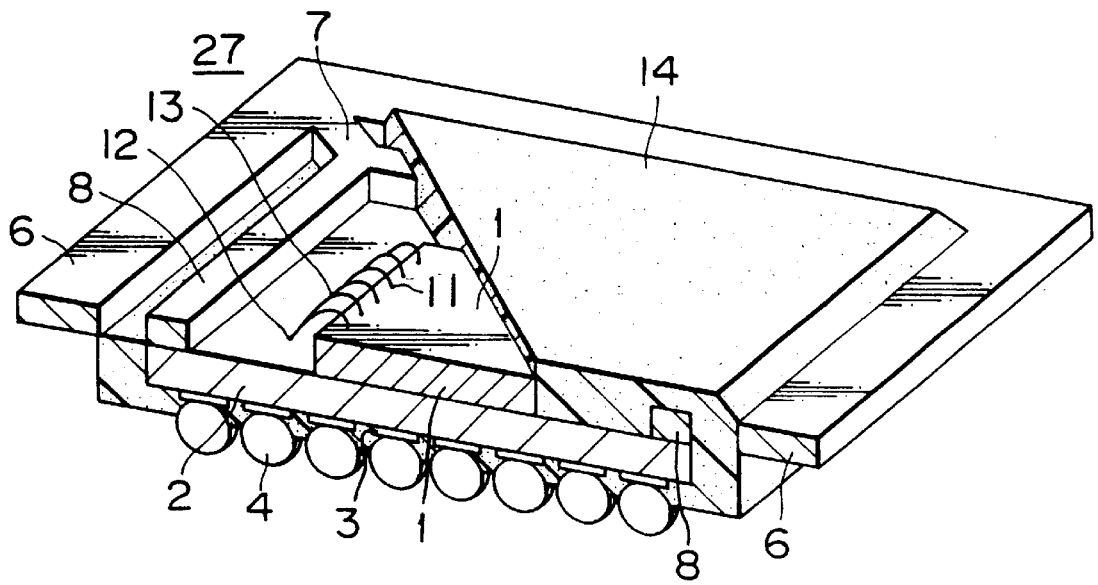
FIG. 5 is a perspective partially broken-away, cross-sectional view of a BGA package structure of a second embodiment.
Figure 26A:
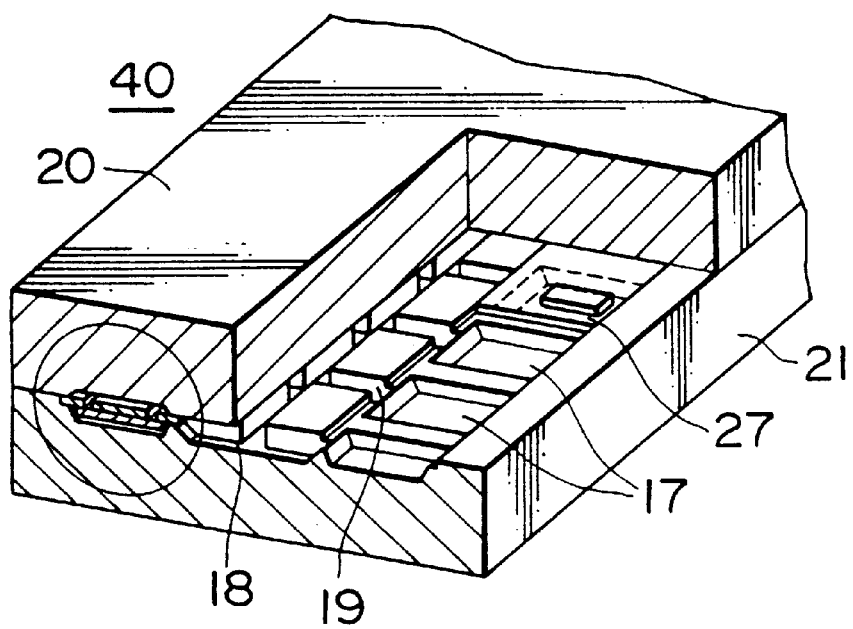
FIGS. 26A and 26B are a perspective partially broken-away, cross-sectional view and a partially enlarged view, respectively, of a mold which has molded the second embodiment.
Figure 26B:
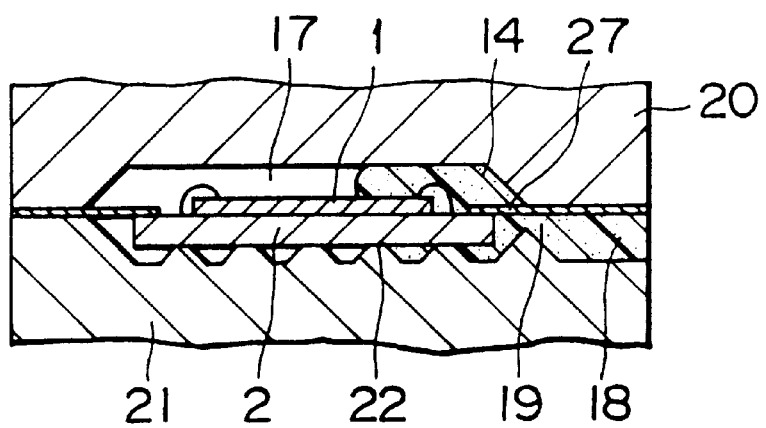

FIG. 5 is a perspective view of a BGA package structure composed of a supporting lead frame (ii) 27, which has no tab and tab supporting part, as a second embodiment of the present invention. The IC chip 1 is directly bonded to the circuit board 2. The supporting frame (ii) 27 is bonded at the rim 8 to the board 2 to thereby thin the resulting package. The placement of pads 12 on the circuit board 2 is freely designable. A process in which the chip is wire bonded to the board is facilitated, advantageously. In the resin molding, the mold 16 of FIGS. 3B(b) and 3B(c) is required to be replaced with a mold (ii) 40 of FIGS. 26A and 26B. A punching die 24 of FIG. 4B(b) used is required to be suitable for the shape of the package, of course.

Figure 6:
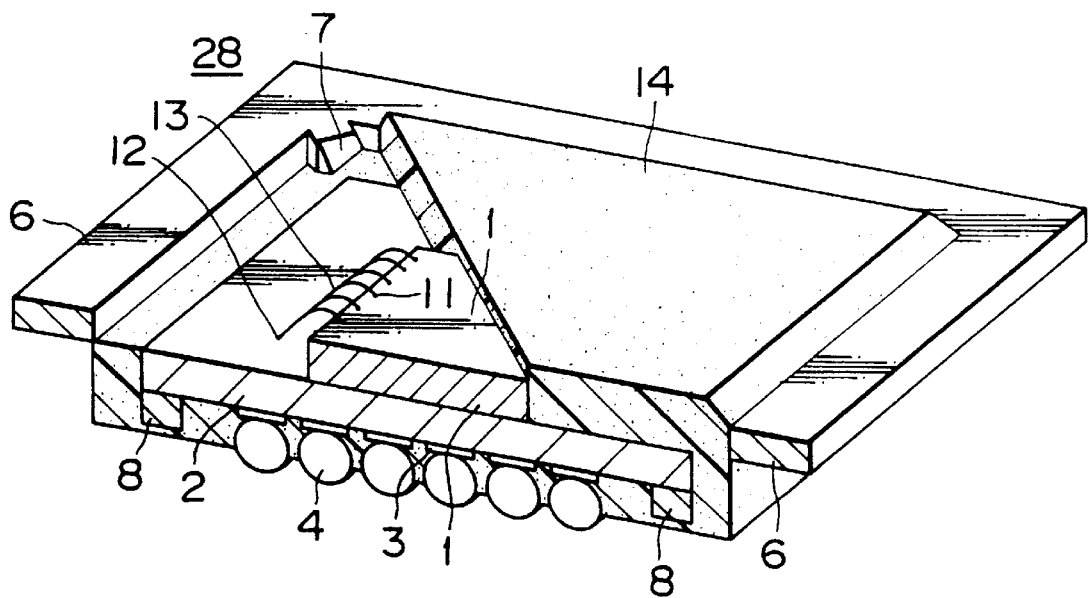
FIG. 6 is a perspective partially broken-away, cross-sectional view of a BGA package structure of a third embodiment.
Figure 27A:
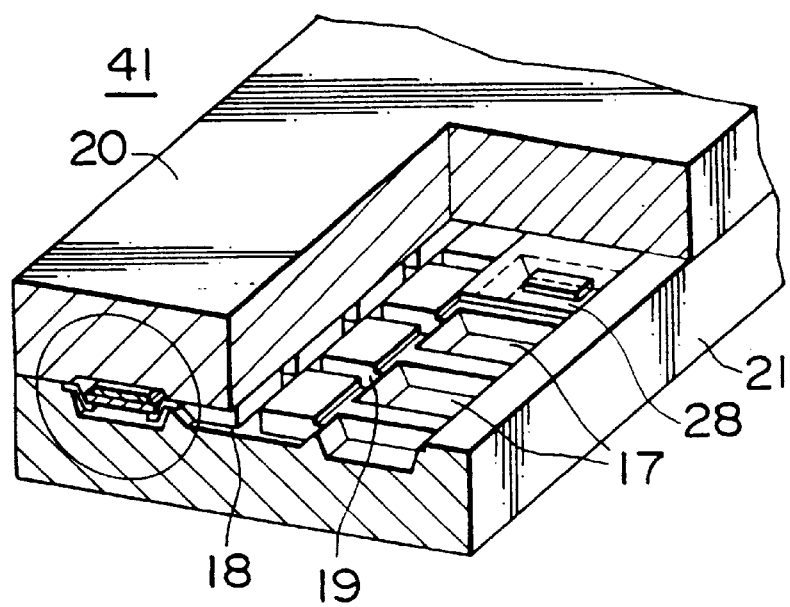
FIGS. 27A and 27B are a perspective partially broken-away, cross-sectional view and a partially enlarged cross-sectional view, respectively, of a mold which has molded the third embodiment.
Figure 27B:
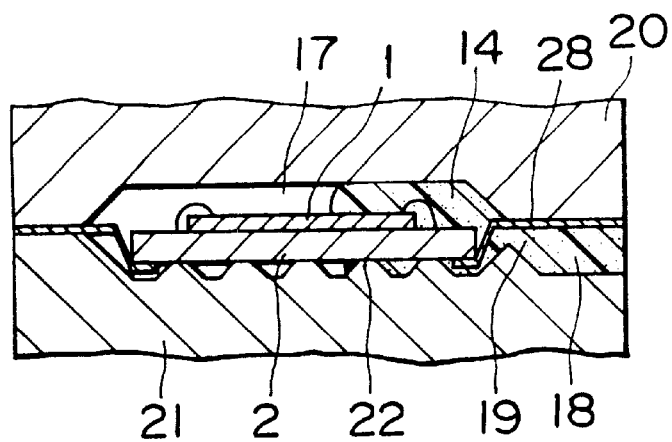

FIG. 6 is a partially cut-away perspective view of a BGA package as a third embodiment of the present invention which includes a supporting frame (iii) 28 in which a supporting part 7 of the lead frame for settling the circuit board is bent such that a rim 8 of the lead frame is fixedly bonded to the packaging surface of the circuit board 2 on which terminals 3 are provided. In this arrangement, advantageously, pads 12 are freely disposed on the circuit board 2 even when the number of pads is large. The chip is easily wire bonded to the circuit board. In the resin molding, the mold 16 of FIGS. 3B(b) and (c) is required to be replaced with a mold (iii) 41 of FIGS. 27A and 27B. A punching die 24 of FIG. 4B(b) used is required to be suitable for the shape of the package, of course.

The first-third embodiments each have a structure in which all the components excluding the terminals 3 on the circuit board 2 are sealed with resin to thereby ensure high moisture-proof reliability. This sealing may be achieved with an inorganic material to produce a similar sealing effect.

Figure 7:
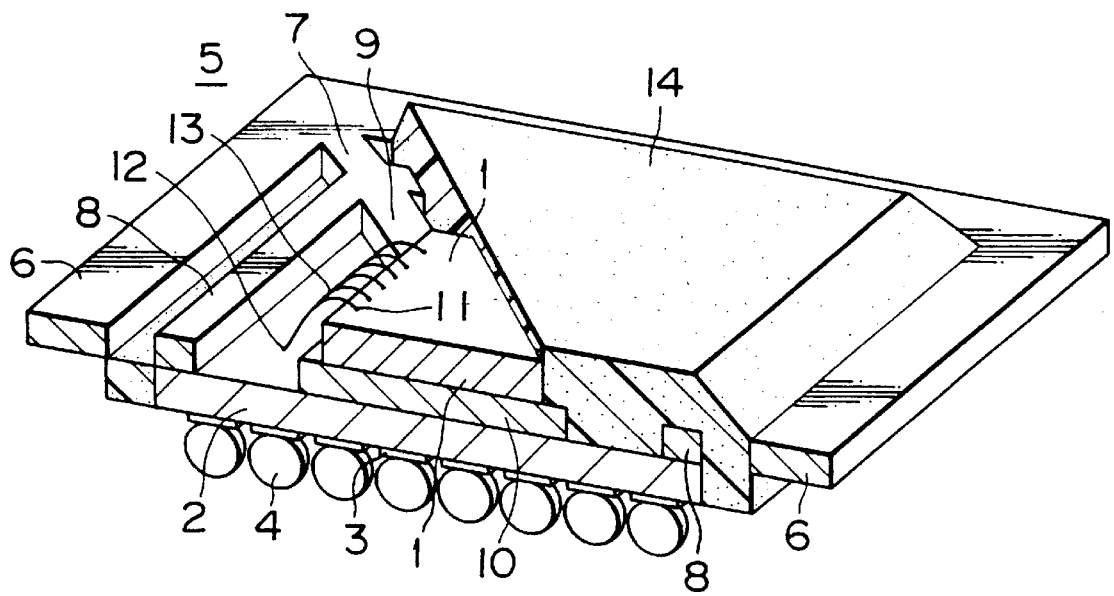
FIG. 7 is a perspective partially broken-away, cross-sectional view of a BGA package structure of a fourth embodiment.
Figure 8:
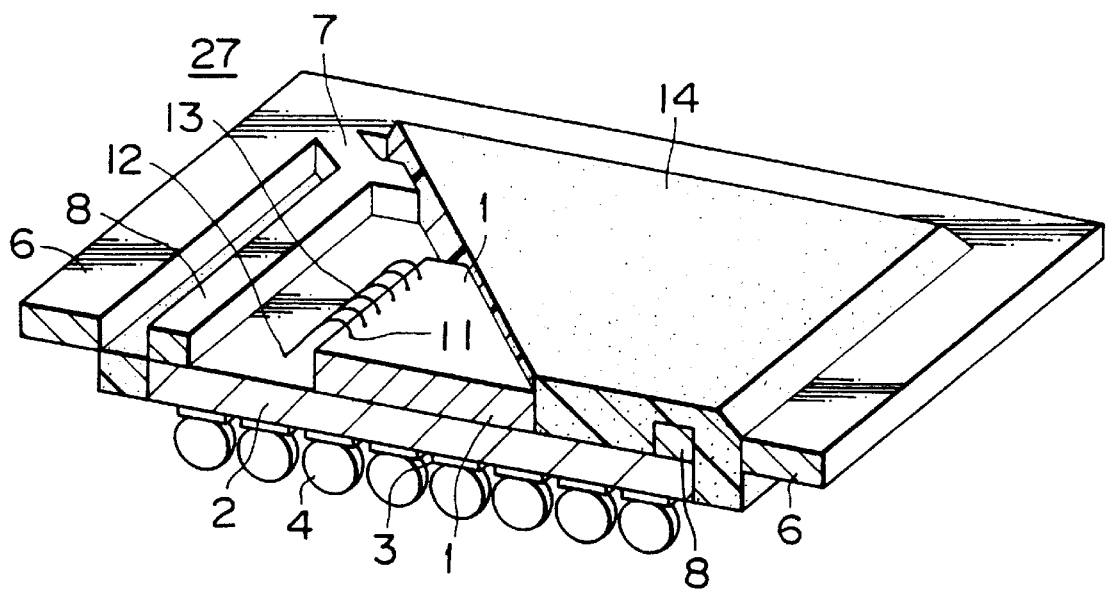
FIG. 8 is a perspective partially broken-away, cross-sectional view of a BGA package structure of a fifth embodiment.

A package structure resin-sealed up to the side of the circuit board thereof as a fourth embodiment will be described next with reference to FIG. 7. The structure of the supporting frame is similar to that of the first embodiment. A fifth embodiment is shown in FIG. 8 where the supporting frame structure is similar to that of the second embodiment.

Figure 28A:
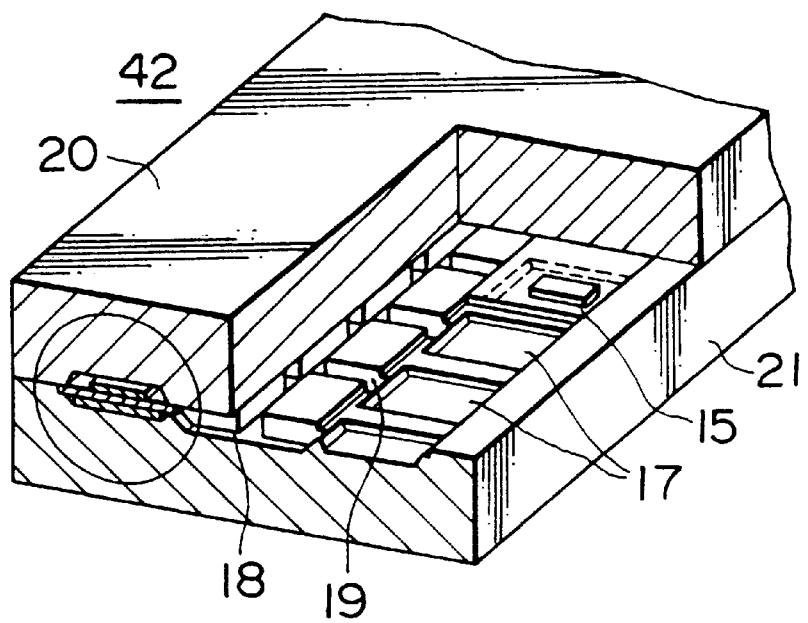
FIGS. 28A and 28B are a perspective partially broken-away, cross-sectional view and a partially enlarged cross-sectional view, respectively, of a mold which has molded the fourth embodiment.
Figure 28B:
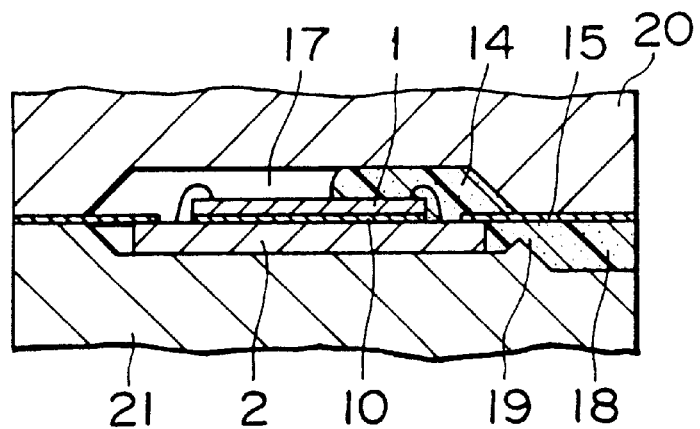
Figure 29A:
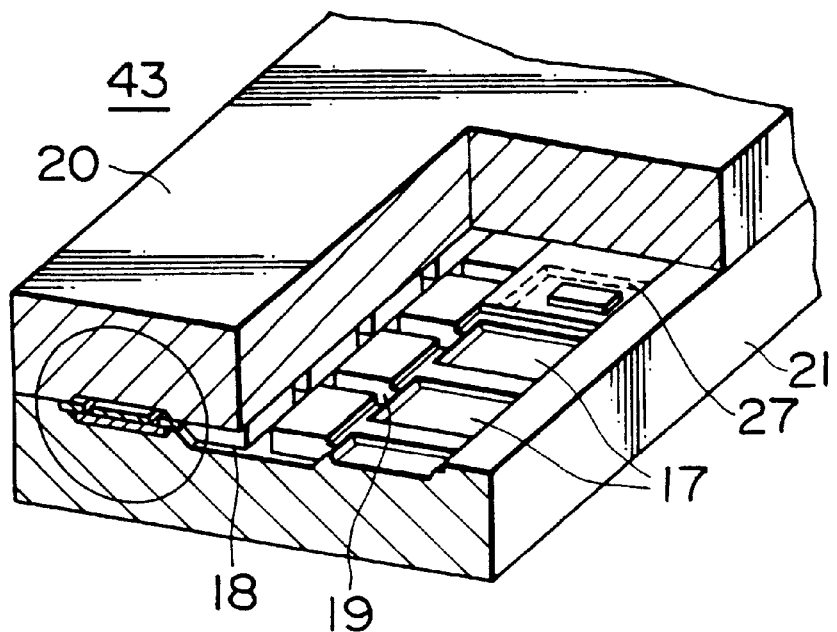
FIGS. 29A and 29B are a perspective partially broken-away, cross-sectional view and a partially enlarged cross-sectional view, respectively, of a mold which has molded the fifth embodiment.
Figure 29B:
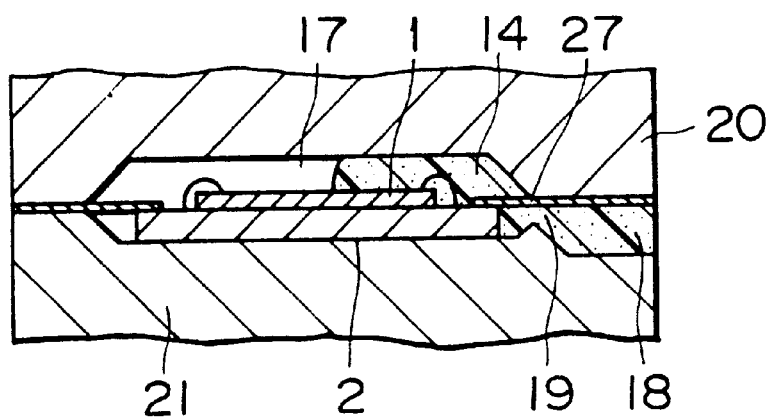

The fourth and fifth embodiments are useful when the number of terminals 3 on the circuit board is large and hence resin sealing is difficult. In the resin molding of the fourth embodiment, the mold 16 of FIGS. 3B(b) and 3B(c) is required to be replaced with a mold (iv) 42 of FIGS. 28A and 28B. In the resin molding of the fifth embodiment, the mold 16 of FIGS. 3B(b) and 3B(c) is required to be replaced with a mold (v) 43 of FIGS. 29A and 29B. In this case, of course, the punching die 24 of FIG. 4B(b) is required to be replaced with an appropriate one conforming to the shape of the molded product. The formation of a cavity in the mold (no projections of the lower cavity half are required, which will be described later) is facilitated and the manufacturing cost is reduced, advantageously.

Figure 9:
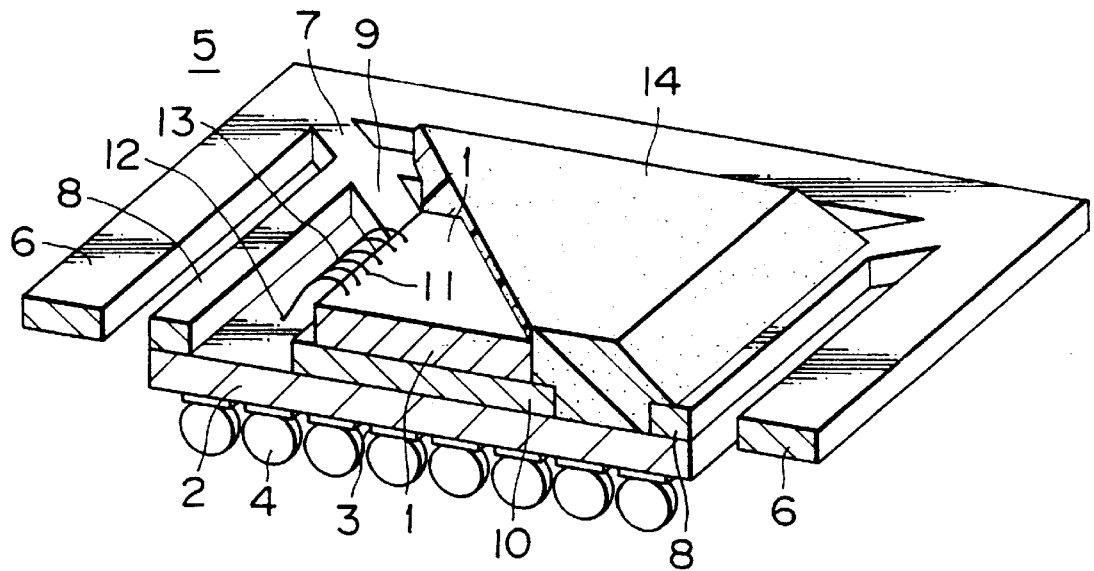
FIG. 9 is a perspective partially broken-away, cross-sectional view of a BGA package structure of a sixth embodiment.
Figure 10:
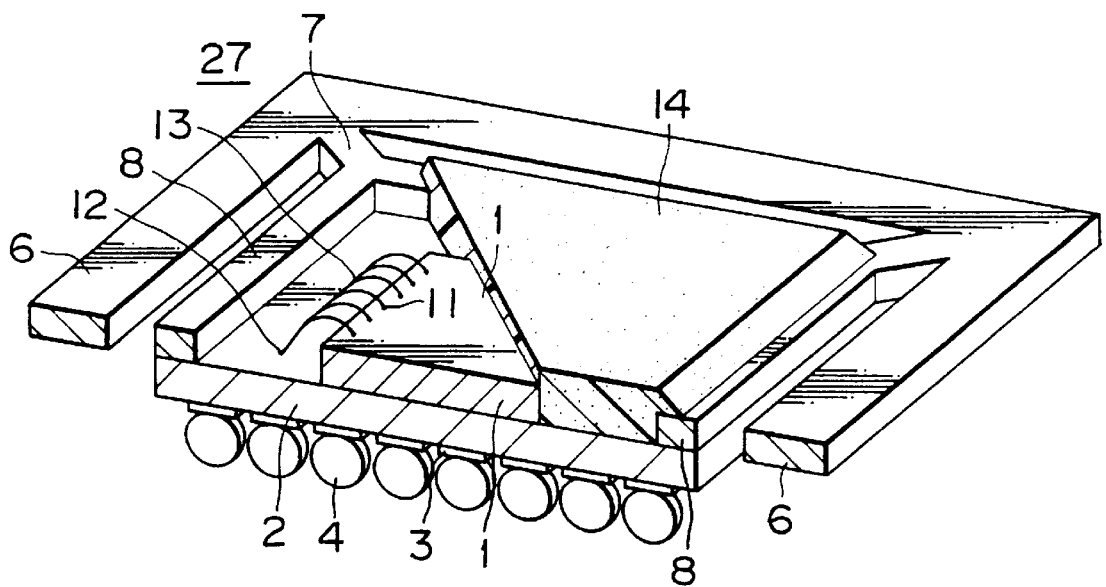
FIG. 10 is a perspective partially broken-away, cross-sectional view of a BGA package structure of a seventh embodiment.
Figure 11A:
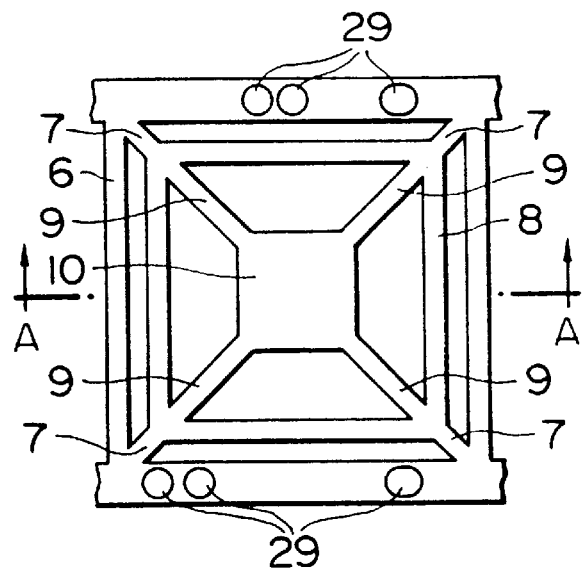
FIG. 11A is a plan view of the supporting frame used in the first, fourth, and sixth embodiments.
Figure 11B:
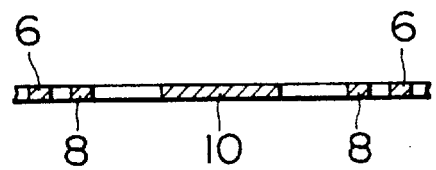
FIG. 11B is a cross-sectional view taken along the line A—A of FIG. 11A.
Figure 12A:
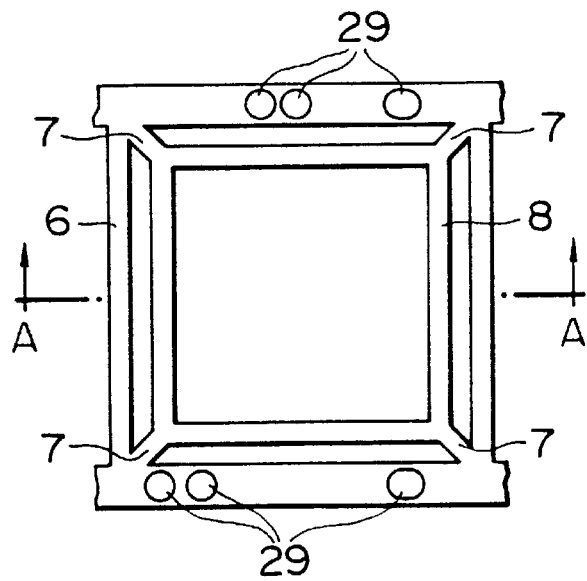
FIG. 12A is a plan view of the supporting frame used in the second, fifth, and seventh embodiments.
Figure 12B:
FIG. 12B is a cross-sectional view taken along the line A—A of FIG. 12A.
Figure 13A:
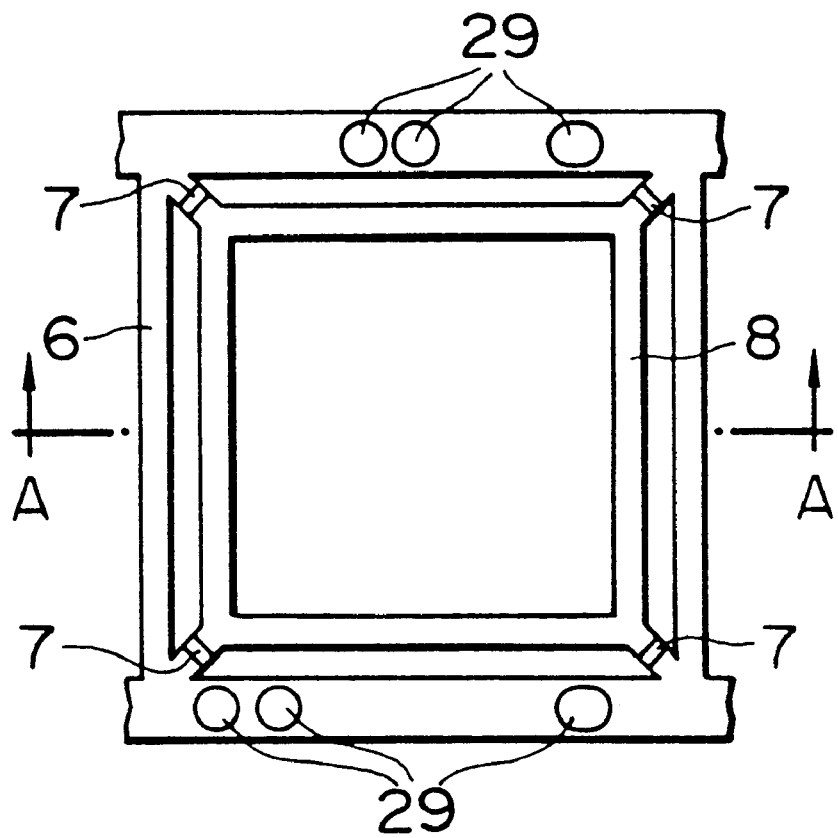
FIG. 13A is a plan view of the supporting frame used in the third embodiment.
Figure 13B:
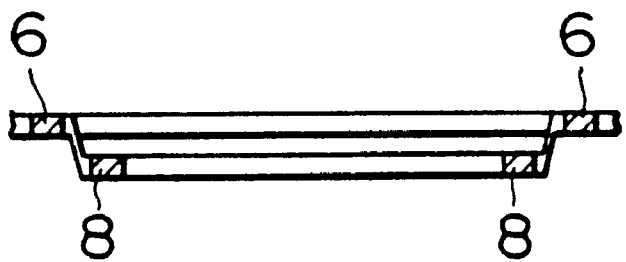
FIG. 13B is a cross-sectional view taken along the line A—A of FIG. 12A.

A package structure in which a chip and the chip mounting surface of a circuit board are resin-sealed will be described with reference to FIG. 9 which shows a sixth embodiment of the invention. The supporting frame has a similar structure to that of the first embodiment. A seventh embodiment is shown in FIG. 10 where the supporting frame has a structure similar to that of the second embodiment. The manufacture of a mold for this molding is facilitated and hence the manufacturing cost is reduced, advantageously.

Figure 30A:
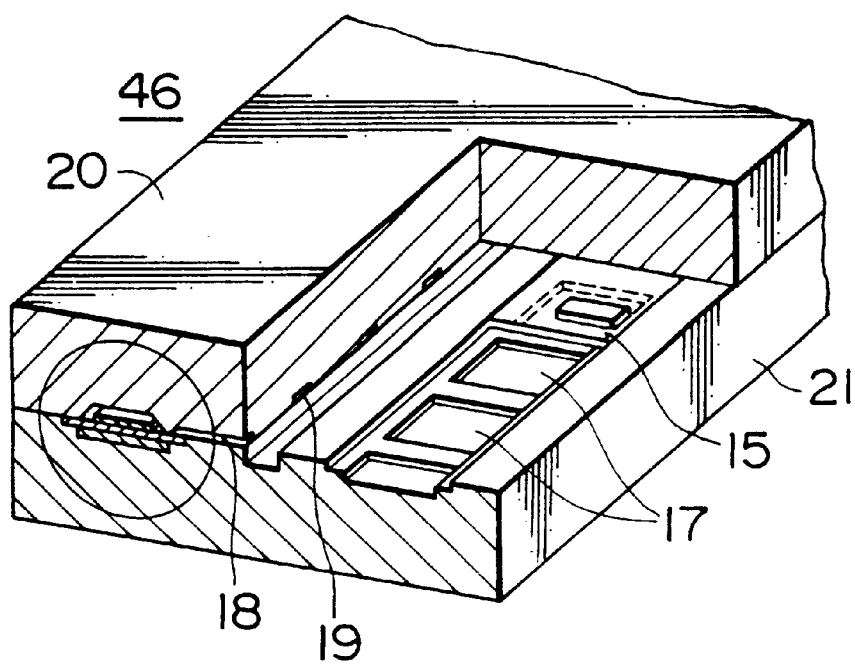
FIGS. 30A and 30B are a perspective partially broken-away, cross-sectional view and a partially enlarged cross-sectional view, respectively, of a mold which has molded the sixth embodiment.
Figure 30B:
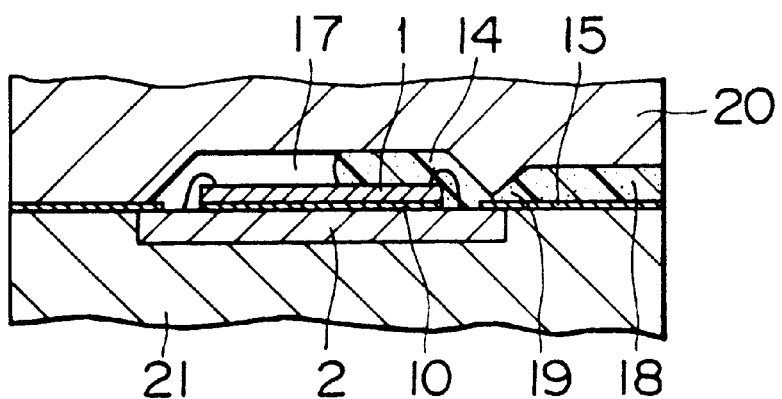
Figure 31A:
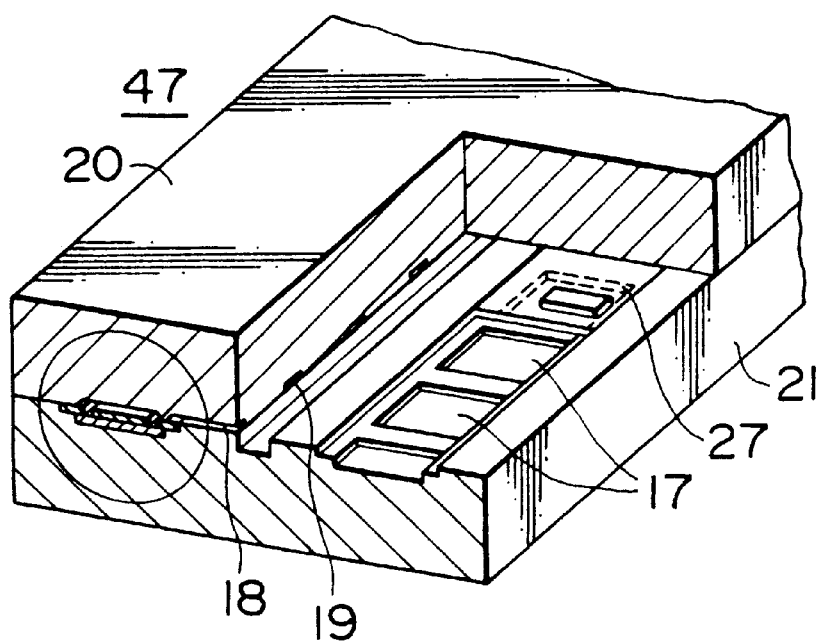
FIGS. 31A and 31B are a perspective partially broken-away, cross-sectional view and a partially enlarged cross-sectional view, respectively, of a mold which has molded the seventh embodiment.
Figure 31B:
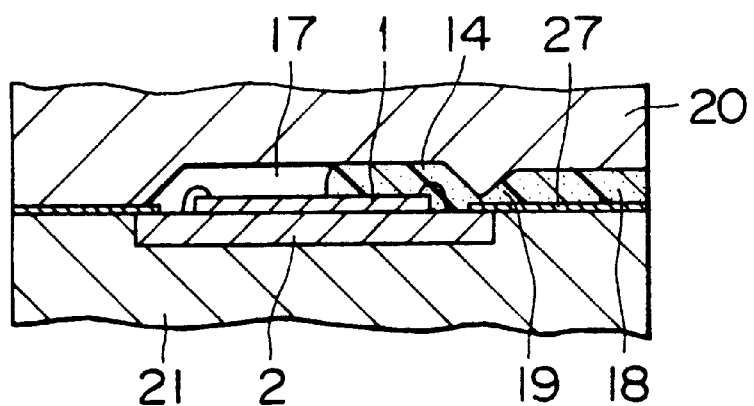

The sixth and seventh embodiments are useful when the number of terminals 3 on the circuit board is large and hence resin sealing is difficult. In the resin molding of the sixth embodiment, the mold 16 of FIGS. 3B(b) and 3B(c) is required to be replaced with a mold (vi) 46 of FIGS. 30A and 30B. In the resin molding of the seventh embodiment, the mold 16 of FIGS. 3B(b) and 3B(c) is required to be replaced with a mold (vii) 47 of FIGS. 31A and 31B. In this case, of course, the punching die 24 of FIG. 4B(b) is required to be an appropriate one conforming to the shape of the molded product. The manufacture of a cavity in the mold (no projections of the lower cavity half are required) is facilitated and the manufacturing cost is reduced, advantageously.

While the board material used in the first-seventh embodiments has been described mainly as being composed of an organic material, an inorganic material may be instead used safely in accordance with the purpose of use of the package. What can be said in common in the first-seventh embodiments is that the use of the supporting frame permits avoidance of possible damages to the board when the runner and gate which will be useless after the molding process are cut away. In this case, the resin sealed package is connected only through the supporting part of the lead frame to the rim of the supporting frame, so that no stress is applied to the circuit board when the rim of the lead frame is cut away to thereby enhance the reliability. When the chip produces much heat in the operation and the heat is required to be radiated greatly, the rim 6 of the lead frame to be cut away may be used advantageously as a heat radiator, without being cut away.

FIGS. 11–16 show patterns of the stamped-out supporting frames 5 used in the first-seventh embodiments. FIGS. 11A and 11B are a plan view of the supporting frame used in the first, fourth and sixth embodiments and a cross-sectional view taken along the line A—A of FIG. 11A, respectively. The rim 6 of the lead frame is connected to the rim 8 of the lead frame by the tab supporting part 7 of the lead frame. A tab 10 is connected by a tab supporting part 9 of the lead frame to the rim 8. FIGS. 12A and 12B are a plan view of the supporting part of the lead frame used in the second, fifth and seventh embodiments and a cross-sectional view taken along the line A—A of FIG. 12A, respectively. The rims 6 and 8 are connected by the supporting part 7. FIGS. 13A and 13B are respectively a plan view of the supporting part of the lead frame used in the third embodiment and a cross-sectional view taken along the line A—A of FIG. 13A. The rims 6 and 8 are connected by the supporting part 7 of the lead frame. The supporting part 7 is bent such that the rim 8 is placed below the rim 6. While the respective components of lead frame are illustrated as connected at four points, the number of components may be increased/decreased as required.

Figure 14A:
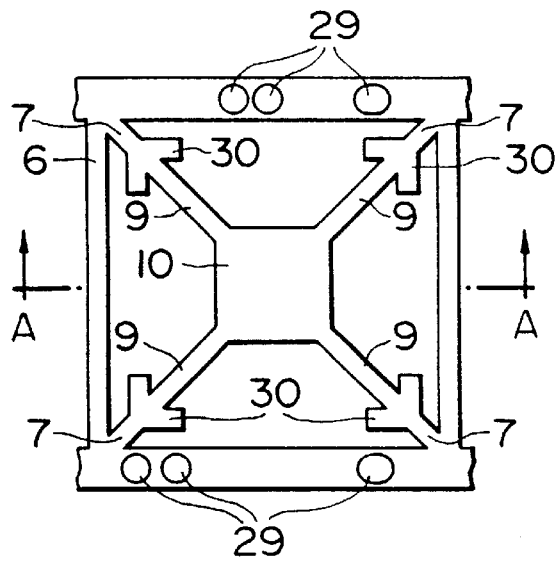
FIG. 14A is a plan view of a modification of the supporting frame of FIG. 11.
Figure 14B:
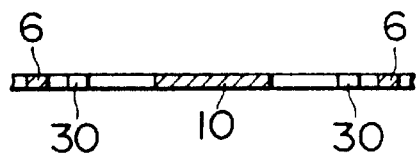
FIG. 14B is a cross-sectional view taken along the line A—A of FIG. 14A.
Figure 15A:
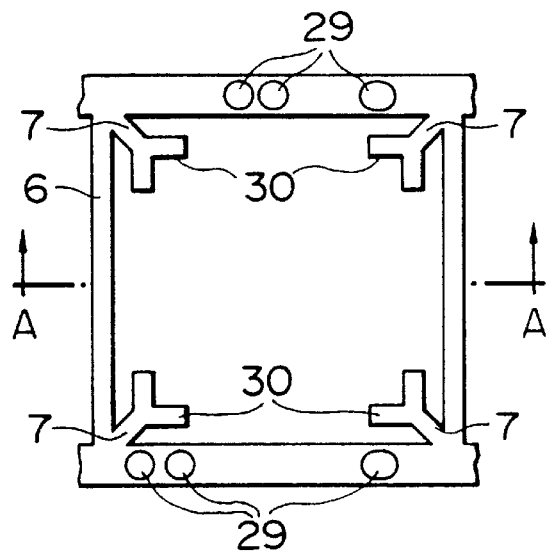
FIG. 15A is a plan view of a modification of the supporting frame of FIG. 12.
Figure 15B:
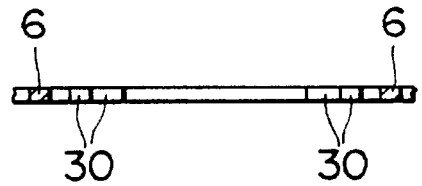
FIG. 15B is a cross-sectional view taken along the line A—A of FIG. 15A.
Figure 16A:
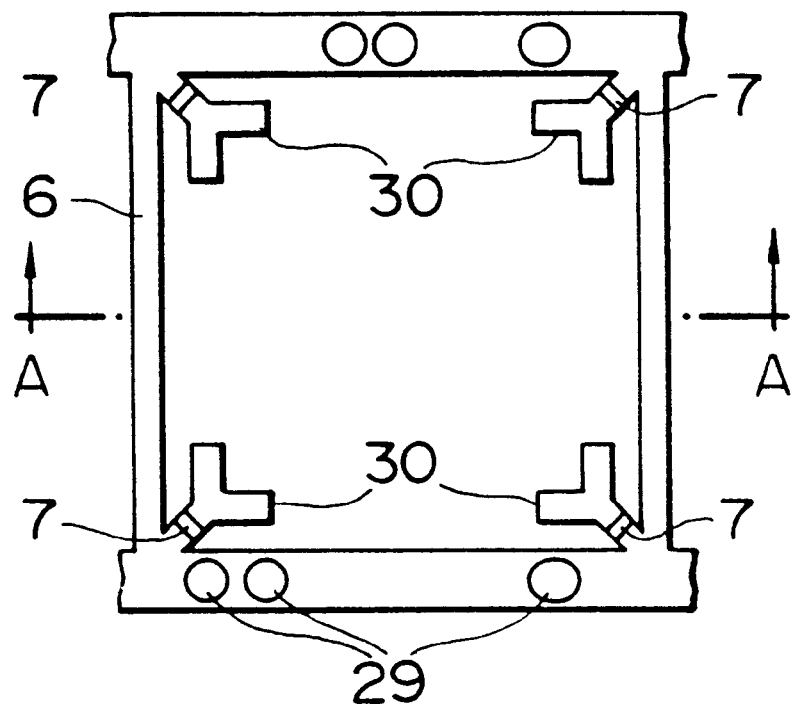
FIG. 16A is a plan view of a modification of the supporting frame of FIG. 13.
Figure 16B:
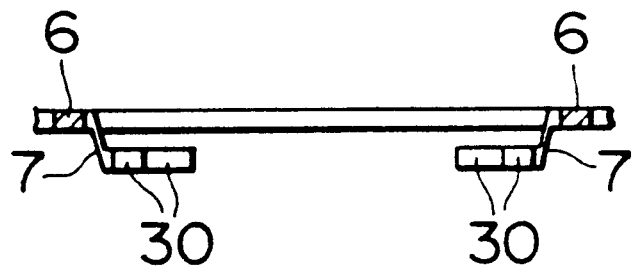
FIG. 16B is a cross-sectional view taken along the line A—A of FIG. 16A.

FIGS. 14–16 show a stamped-out supporting frame 5 when a portion 30 of a lead frame for settling a circuit board thereon is bonded at four points in place of the form of the rim 8. FIG. 14A is a plan view of the supporting frame which includes the supporting part of the lead frame of FIGS. 11A and 11B with the rim of the lead frame for settling the circuit board being partially cut away. FIG. 14B is a cross-sectional view taken along the line A—A of FIG. 14A. FIG. 15A is a plan view of the supporting frame which includes the supporting part of the lead frame of FIGS. 12A and 12B with the rim of the lead frame for settling the circuit board being partially cut away. FIG. 15B is a cross-sectional view taken along the line A—A of FIG. 15A. FIG. 16A is a plan view of the supporting frame which includes the supporting part of the lead frame of FIGS. 13A and 13B with the rim of the lead frame for settling the circuit board being partially cut away. FIG. 16B is a cross-sectional view taken along the line A—A of FIG. 16A. The use of such supporting lead frames produces a similar effect to that mentioned above, of course. The supporting lead frame of FIGS. 11–16 may be made, for example, of an Fe-Ni alloy or a Cu alloy. While the components of the lead frame have been illustrated as connected at four points, the number of connected components may be increased/decreased as required. The rims 6 of the lead frames illustrated with reference to FIGS. 14–16 have guide holes 29 through which the rims 6 are positioned in the respective manufacturing process steps.

Figure 17:
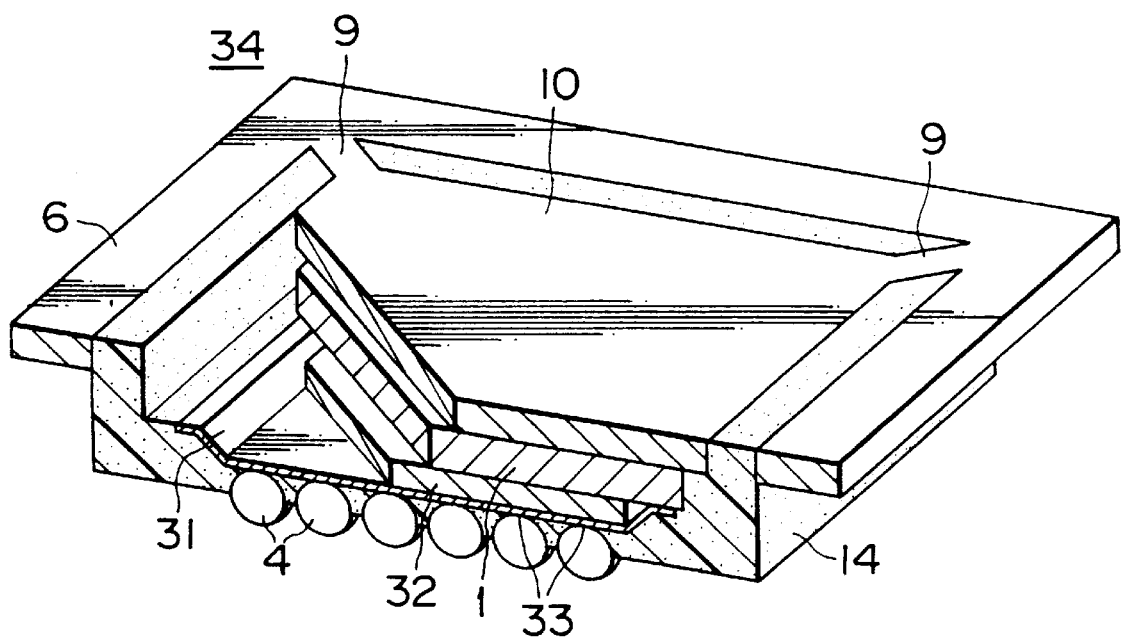
FIG. 17 is a perspective partially broken-away, cross-sectional view of a BGA package structure of an eighth embodiment.

FIG. 17 is a perspective partially broken-away cross-sectional view of a face down type BGA package as an eighth embodiment of the present invention. The BGA package is composed of an IC chip 1, a circuit film 31, the pattern of which is formed on a heat-resisting insulating material, an insulating insert 32, terminals (or electrodes) 33 on the circuit film 31, metal bumps 4 as external terminals joined to the terminals 33 and a supporting frame (iv) 34 which fixes those components. The supporting frame (iv) 34 is composed of a rim 6, a tab supporting part 9 and a tab 10. The tab 10 composes a supporting section to which the IC chip 1 is bonded at its back with an adhesive. Pads (not shown) of the IC chip 1 are metal joined and connected electrically to wiring pads (not shown) of the circuit film 31. The pads on the film 31 are connected to the corresponding external terminals 33. Those components are placed within a mold and sealed with resin 14, except for the back of the tab 10, to complete a package. Thereafter, electrical wiring is completed by joining metal bumps 4, for example, solder balls, to the terminals 33 to provide an article.

Figure 18A:
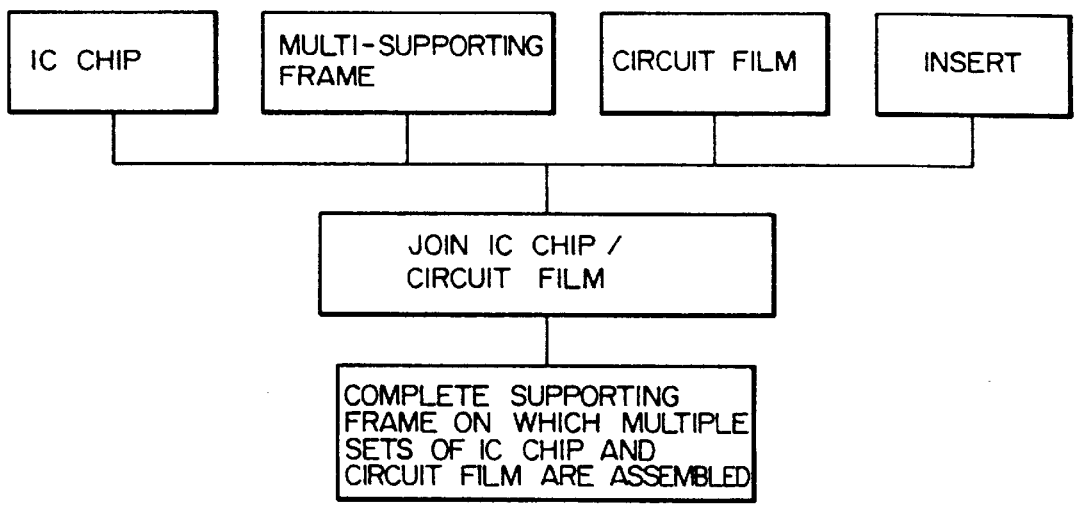
FIG. 18A is a flowchart indicative of a process for assembling a supporting lead frame, several groups of an IC chip and a circuit film.
Figure 18B:
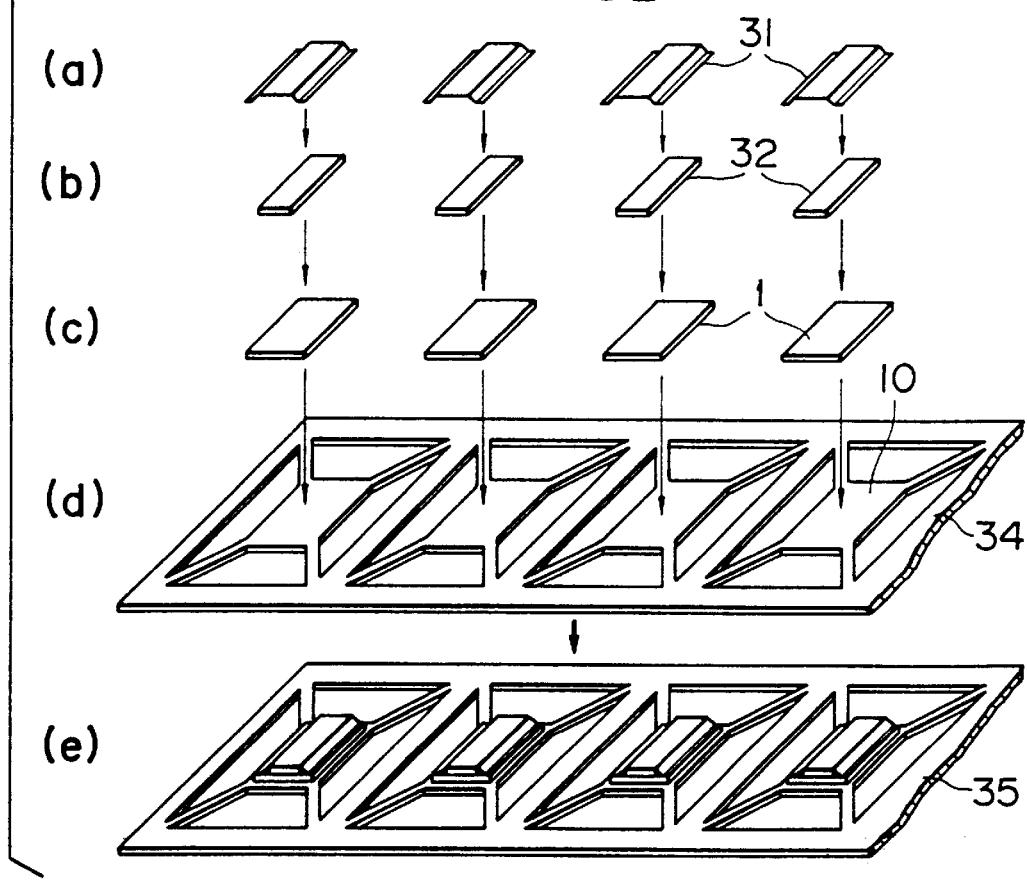
FIG. 18B illustrates the process.
Figure 32A:
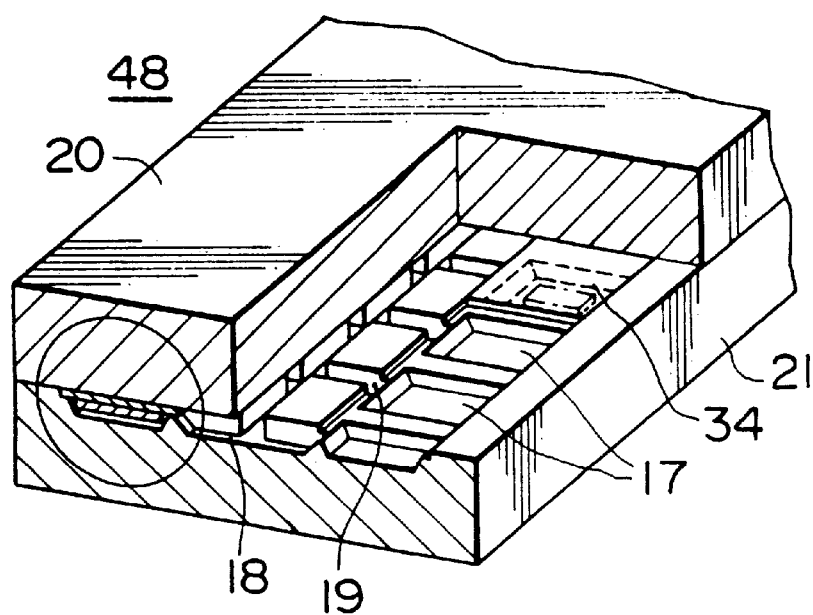
FIGS. 32A and 32B are a perspective partially broken-away, cross-sectional view and a partially enlarged cross-sectional view, respectively, of a mold which has molded the eighth embodiment.
Figure 32B:
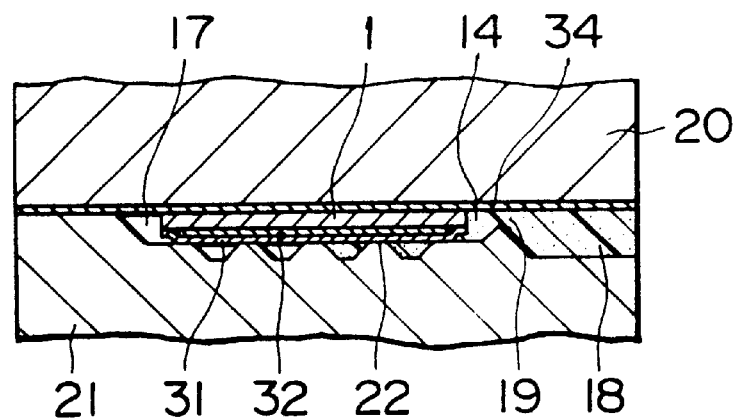

The manufacturing process is outlined in FIG. 18 because the components of the present embodiment are different from those of the first embodiment. A process for simultaneously molding a plurality of packages with resin is performed usually, which will be described. FIG. 18A is a flowchart indicative of a diagrammatical process for assembling a plurality of groups of an IC chip 1, a circuit film 31, and an insert 32 as the components on a multi-supporting frame (iv) 34, and FIG. 18B shows the process diagrammatically. The supporting frame (iv) 34 has a multi-structure as shown in FIG. 18(d) so as to permit molding of a plurality of packages. In this case, IC chips 1 (FIG. 18(c)) are first joined to the respective tabs 10 of the supporting frame (iv) 34. Insulating inserts 32 (FIG. 18(b)) are then joined to the respective IC chips 1 excluding their pads. Finally, the pads (not shown) of the circuit films 31 (FIG. 18(a)) are aligned with the respective chip pads (not shown) and joined to the corresponding inserts 32. The multi-supporting frame (iv) 34 has guide holes (not shown) in its rim which are used to perform the manufacturing process automatically. The IC chips 1 and the corresponding circuit films 31 are electrically connected, for example, by heating and joining to them Au, a solder alloy or other metal material or alternatively by joining to them a conductive resin, for example, a metal powder mixed epoxy resin to thereby complete a supporting lead frame 35 on which the plurality of groups of an IC chip and a circuit film is assembled (FIG. 18(e)). Thereafter, process steps similar to those of FIGS. 3 and 4 described with reference to the first embodiment will be performed. In the course of those process steps, the mold 16 of FIGS. 3B(b), (c) is required to be replaced with a mold (viii) 48 of FIG. 32A and 32B for resin molding purposes. Of course, the punching die 24 of FIG. 4B(b) is required to be replaced with an appropriate one conforming to the shape of a molded product. In such arrangement, the back of the tabs 10 are exposed to thereby dissipate heat greatly. In addition, a forced cooling mechanism such as cooling fins can easily be attached. Since the components excluding the external terminals 33 on the circuit film 31 are sealed with resin, the moisture-proof reliability is increased.

Figure 19:
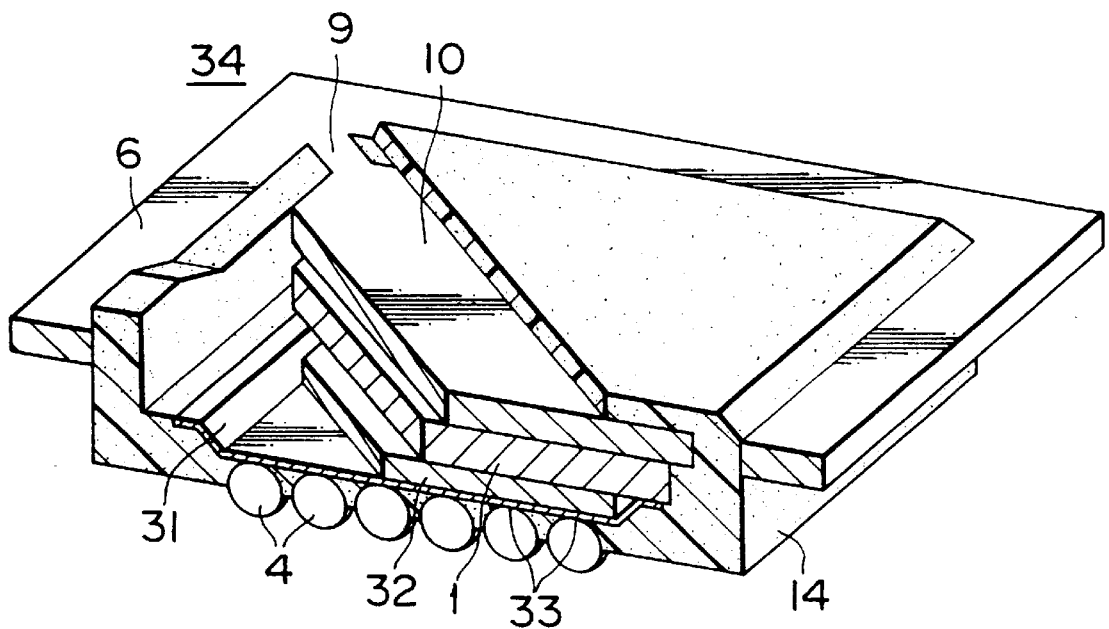
FIG. 19 is a perspective partially broken-away, cross-sectional view of a BGA package structure of a ninth embodiment.
Figure 33A:
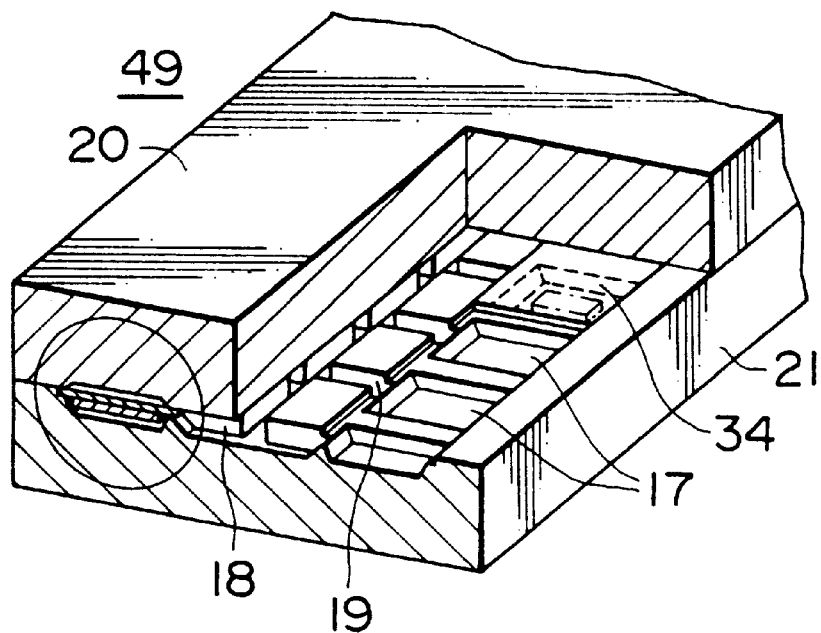
FIGS. 33A and 33B are a perspective partially broken-away, cross-sectional view and a partially enlarged cross-sectional view, respectively, of a mold which has molded the ninth embodiment.
Figure 33B:
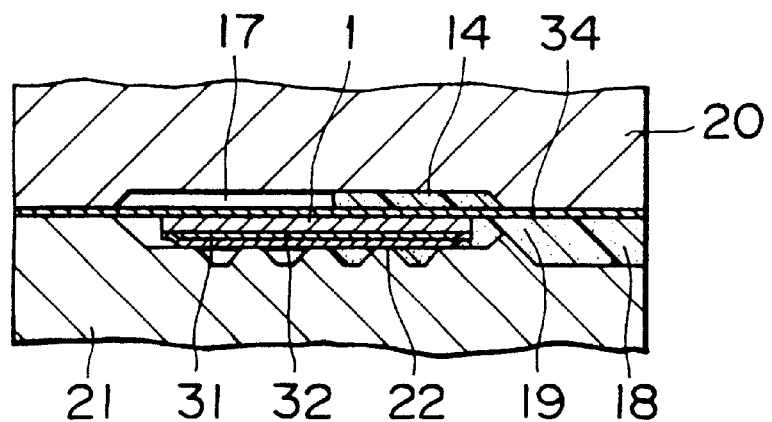

FIG. 19 shows a ninth embodiment in which all the components on the circuit film 31 excluding the external terminals 33 are sealed with resin 14. The mold 16 of FIGS. 3B(b) and (c) is required to be replaced with a mold (ix) 49 of FIGS. 33A and 33B. The mold 24 of FIG. 4B(b) is, of course, required to be replaced with an appropriate one conforming to the shape of a molded product. Such structure satisfies high moisture-proof reliability.

Figure 20:
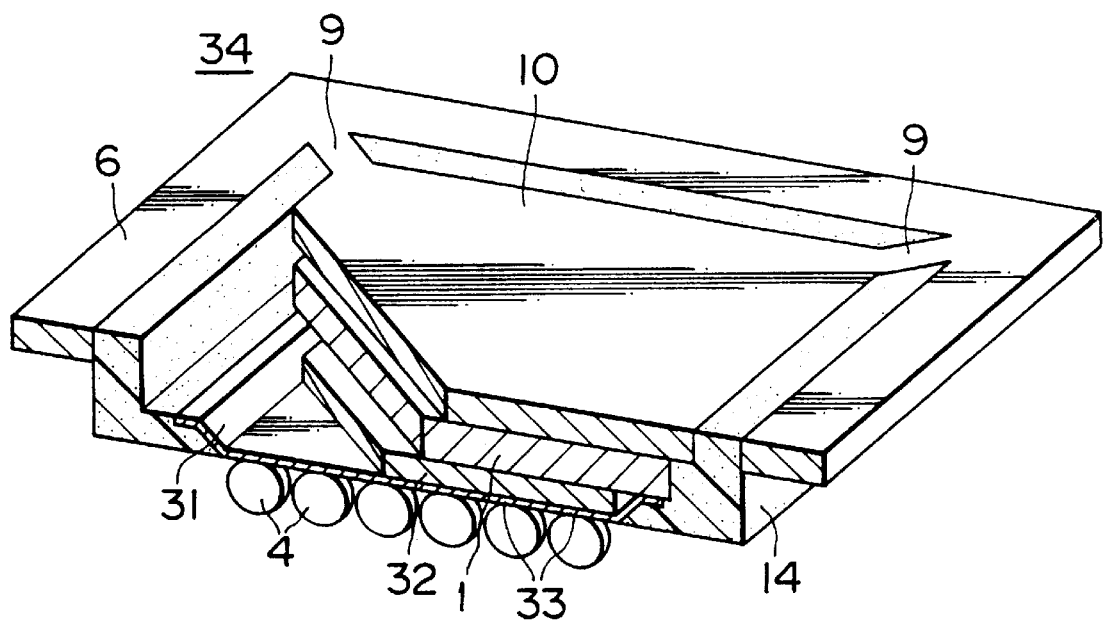
FIG. 20 is a perspective partially broken-away, cross-sectional view of a BGA package structure of a tenth embodiment.
Figure 34A:
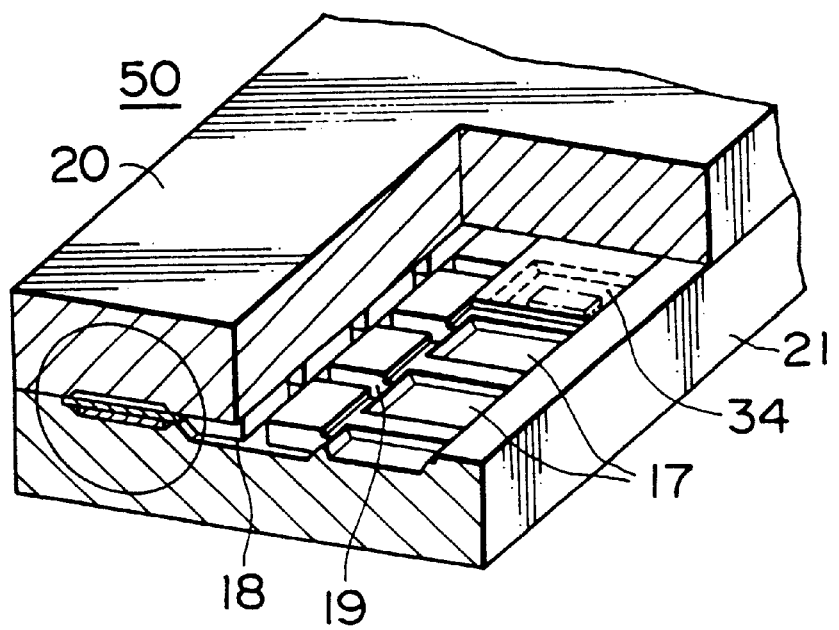
FIGS. 34A and 34B are a perspective partially broken-away, cross-sectional view and a partially enlarged cross-sectional view, respectively, of a mold which has molded the tenth embodiment.
Figure 34B:
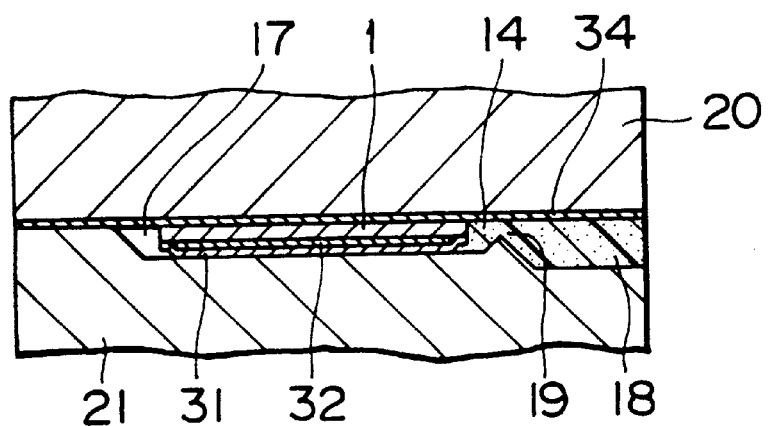

FIG. 20 shows a tenth embodiment where only a chip/circuit film pad bonding portion is sealed with resin. The mold 16 of FIGS. 3B(b) and (c) is required to be replaced with a mold (x) 50 of FIGS. 34A and 34B. The punching die 24 of FIG. 4B(b) is, of course, required to be replaced with an appropriate one conforming to the shape of a molded product. The use of such arrangement serves to provide a thin package.

Figure 21:
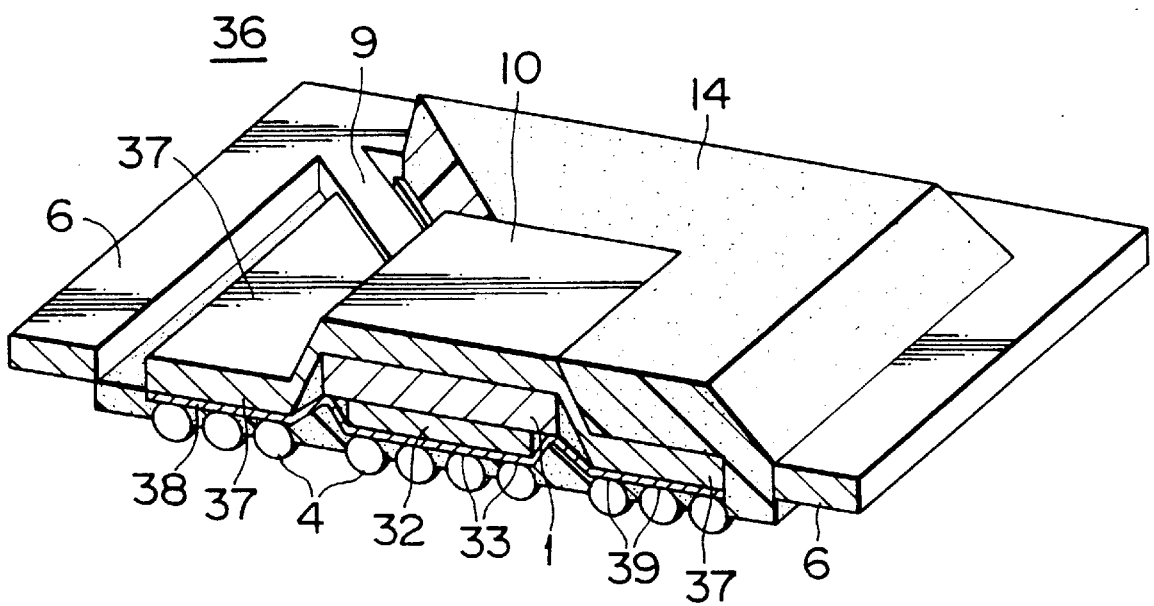
FIG. 21 is a perspective partially broken-away, cross-sectional view of a BGA package structure of an eleventh embodiment.
Figure 35A:
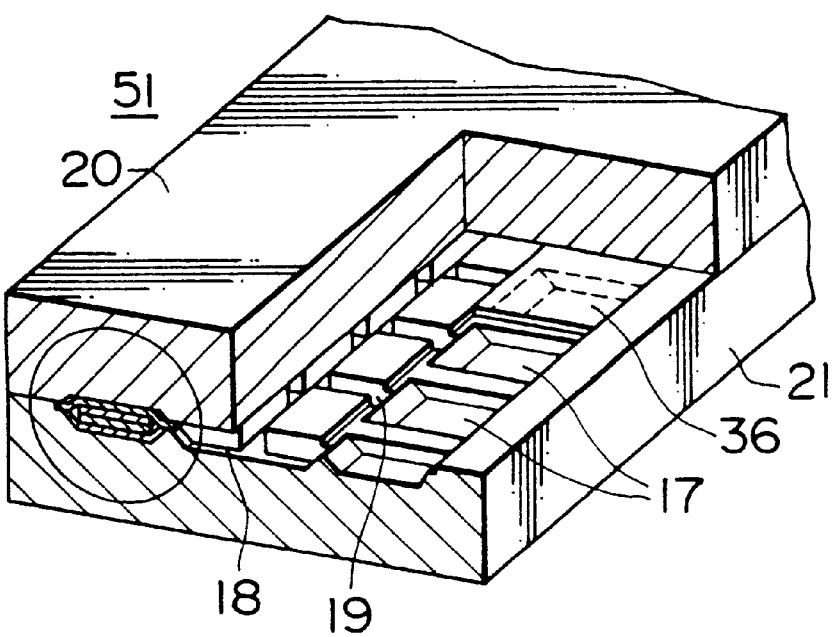
FIGS. 35A and 35B are a perspective partially broken-away, cross-sectional view and a partially enlarged cross-sectional view, respectively, of a mold which has molded the eleventh embodiment.
Figure 35B:
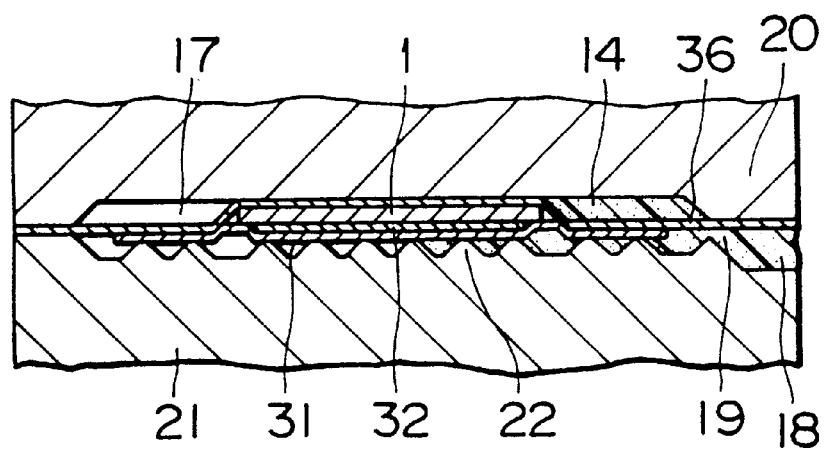

If the number of external terminals is so many that all the external terminals cannot be disposed in the chip area in this arrangement, an eleventh embodiment using a BGA package structure which disposes those terminals well is provided, as shown in FIG. 21. A supporting frame (v) 36 has an extended part 37 of a tab 10 projectable from each side of the tab 10 as required for disposing those external terminals on the extended tab part 37 which cannot be placed on the chip area. The extended part 37 of the tab and the tab supporting part 9 of the lead frame are bent such that terminals 39 on the extended part 38 of the circuit film provided on the extended part 37 of the tab are coplanar with (or the same height as) the terminals (or electrodes) 33 on the circuit film disposed over the IC chip 1, so that when the extended part 38 of the circuit film is joined and fixed, coplanarity is maintained. Under such conditions, the components are resin-sealed to provide a BGA package. The manufacturing process includes the step of assembling the respective components as described with respect to the FIG. 18 and steps similar to those of FIGS. 3 and 4 described with respect to the first embodiment. In this process, resin molding is required to be performed by replacing the mold 16 of FIGS. 3B(b) and (c) with a mold (xi) 51 of FIGS. 35A and 35B. Of course, the punching die 24 of FIG. 4B(b) is required to be replaced with an appropriate one conforming to the shape of a molded product. As is understood, many terminals are easily disposed by changing the shape of the extended part 37 of the tab of the supporting frame (v) 36. The coplanarity of the extended part 38 of the circuit film is ensured easily. Since the tabs 10 are exposed, a cooling mechanism can easily be attached. Heat dissipation is greatly improved through the extended parts 37 of the tab. Of course, the moisture-proof reliability based on the resin sealing is increased.

Figure 22:
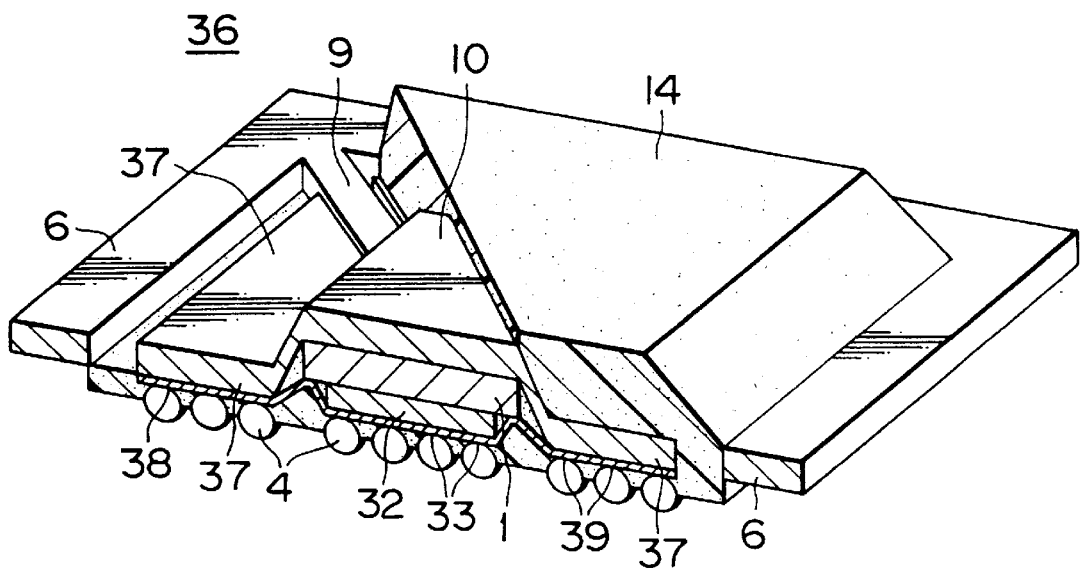
FIG. 22 is a perspective partially broken-away, cross-sectional view of a BGA package structure of a twelfth embodiment.
Figure 23:
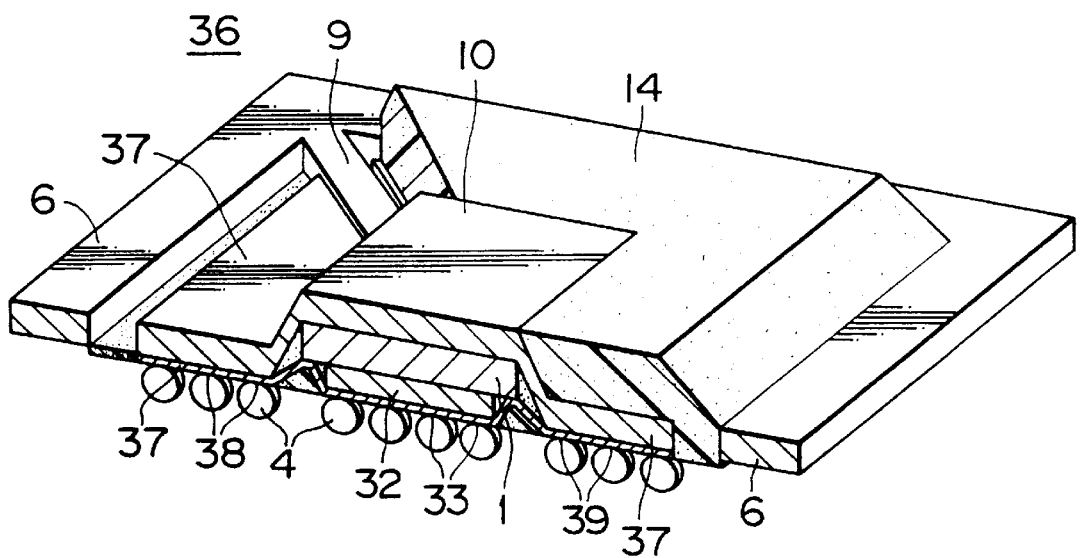
FIG. 23 is a perspective partially broken-away, cross-sectional view of a BGA package structure of a thirteenth embodiment.
Figure 36A:
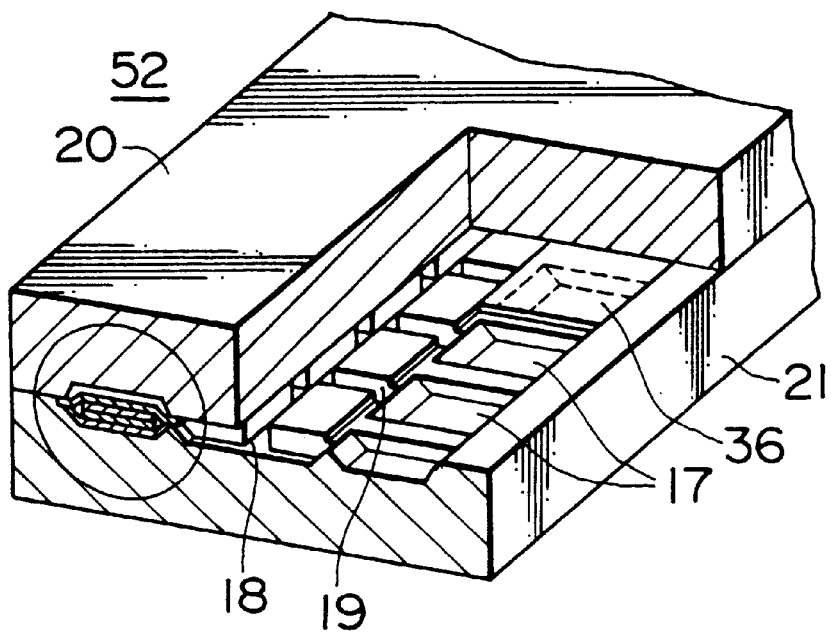
FIGS. 36A and 36B are a perspective partially broken-away, cross-sectional view and a partially enlarged cross-sectional view, respectively, of a mold which has molded the twelfth embodiment.
Figure 36B:
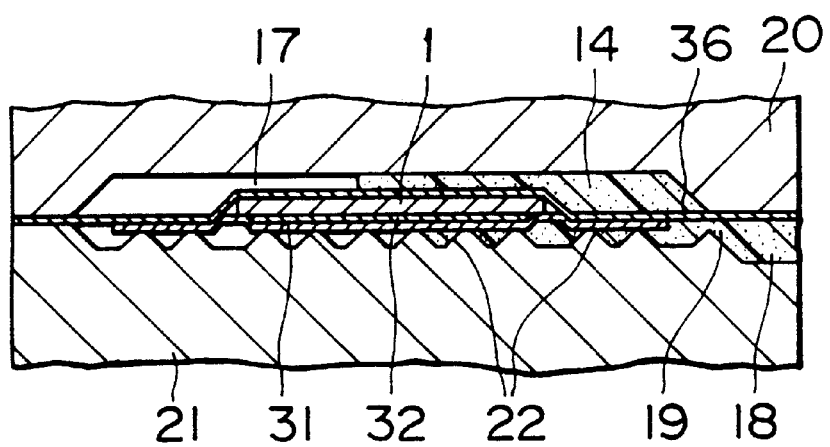
Figure 37A:
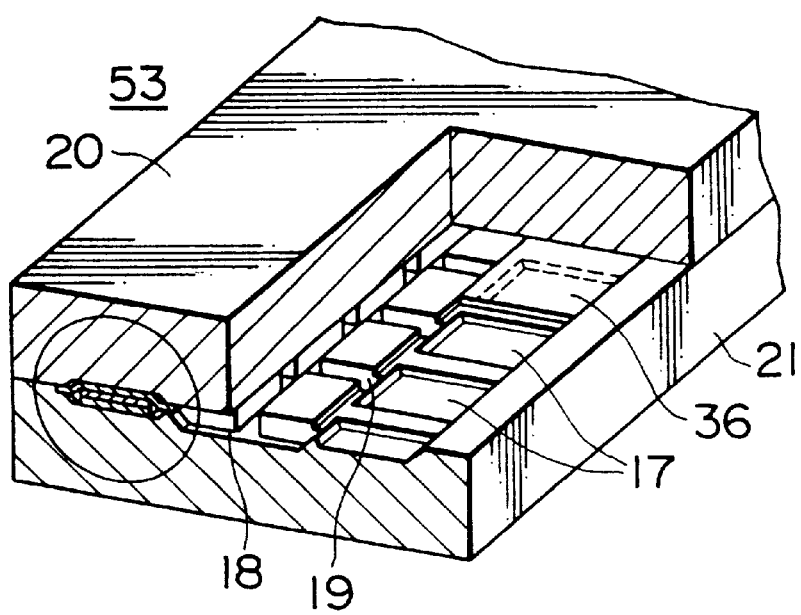
FIGS. 37A and 37B are a perspective partially broken-away, cross-sectional view and a partially enlarged cross-sectional view, respectively, of a mold which has molded the thirteenth embodiment.
Figure 37B:
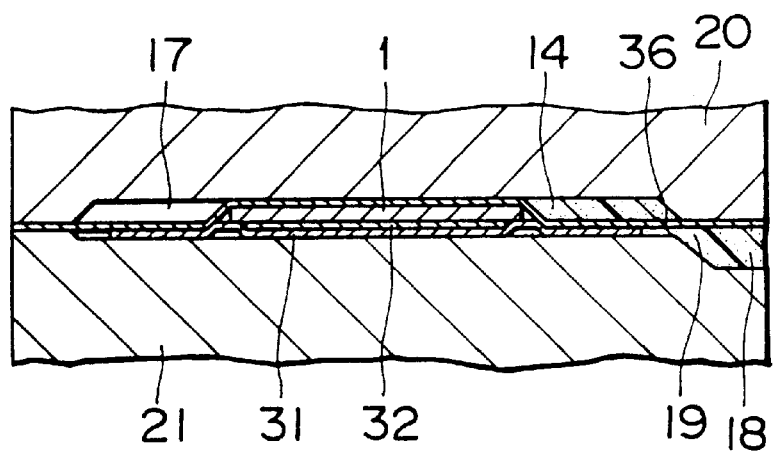
Figure 38:
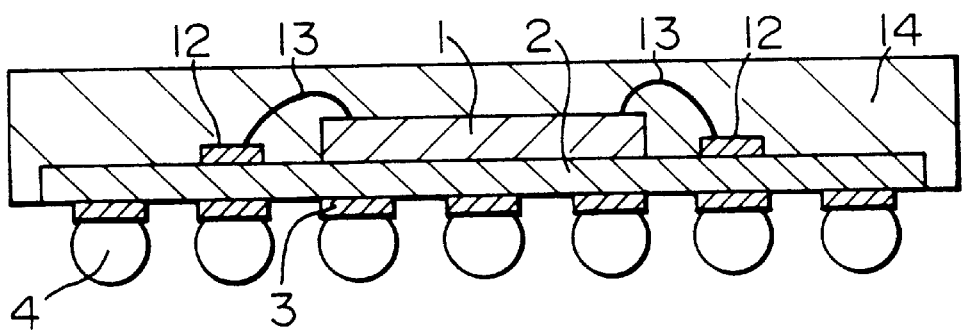
FIG. 38 is a cross-sectional view of a conventional face up type BGA package.
Figure 39:
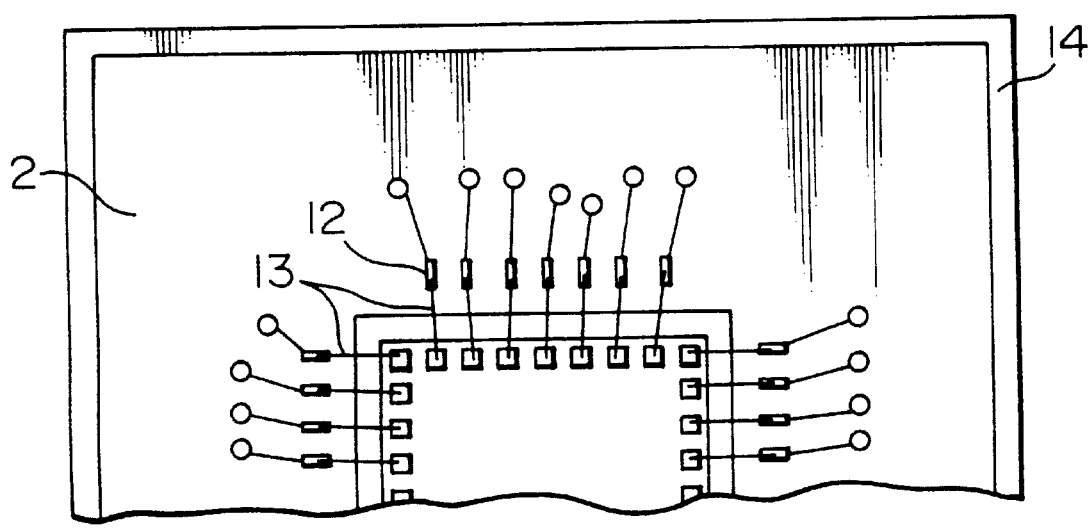
FIG. 39 is a plan view of the BGA package of FIG. 38.
Figure 40:
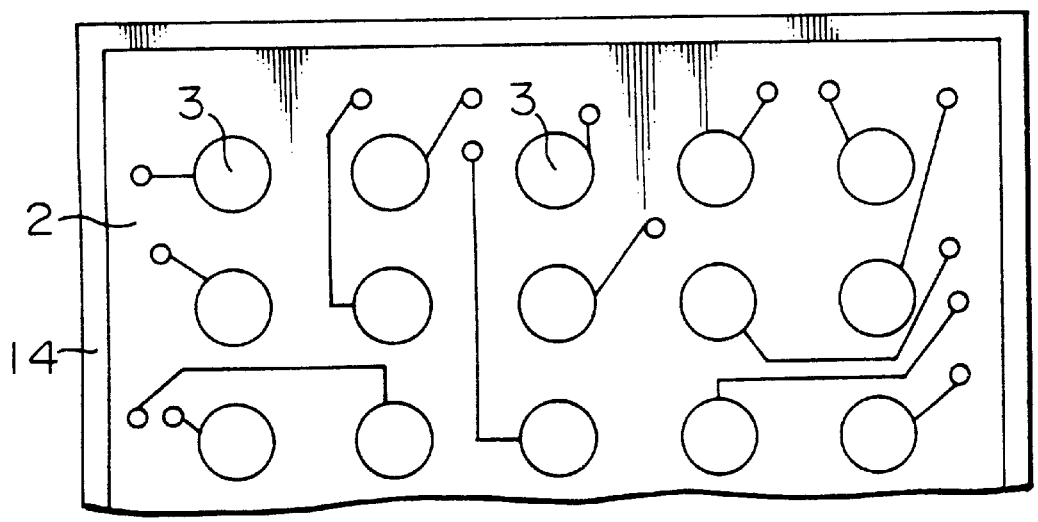
FIG. 40 is a bottom view of the BGA package of FIG. 38.
Figure 41:
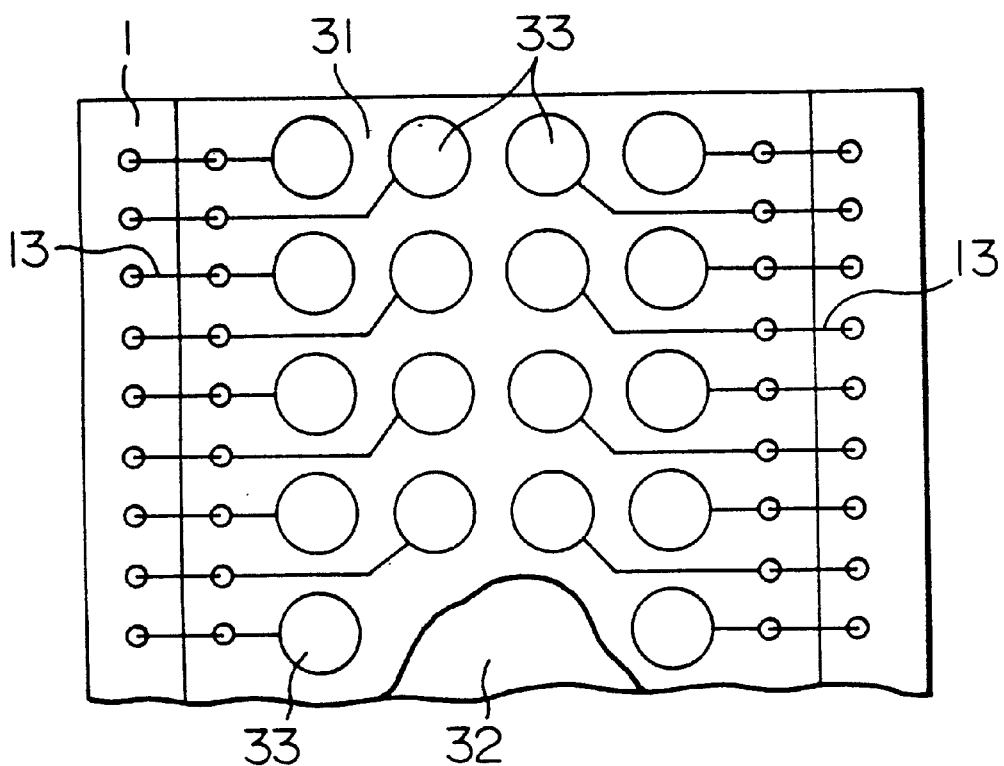
FIG. 41 is a perspective fragmentary cross-sectional view of a conventional face down type BGA package.
Figure 42:
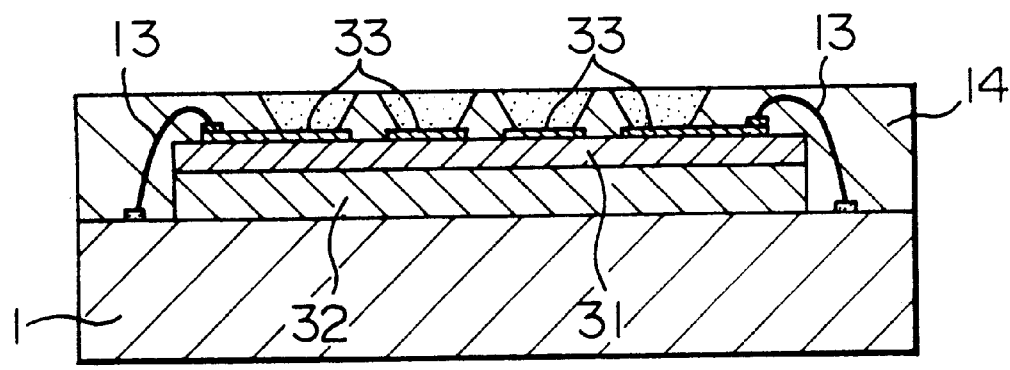
FIG. 42 is an enlarged view of a connection of FIG. 41.

FIGS. 22 and 23 show a twelfth and a thirteenth embodiment, respectively, which are different in resin seal in dependence on the requirements of an article. In the resin molding, the mold 16 of FIGS. 3B(b), (c) is required to be replaced with a mold (xii) 52 of FIGS. 36A and 36B in the twelfth embodiment, whereas the mold 16 of FIGS. 3B(b), (c) is required to be replaced with a mold (xiii) 53 of FIGS. 37A and 37B in the thirteenth embodiment. The punching die 24 of FIG. 4B(b) is required to be replaced with an appropriate one conforming to the shape of a molded product, of course. Those package structures have features similar to those mentioned in the eleventh embodiment, of course.

What can be said in common in the eighth-thirteenth embodiments is that the use of the supporting frame serves to avoid possible damages to the circuit board when the runner and gate which are rendered useless after molding are cut away. Since the resin sealed package is connected only by the tab supporting part of the lead frame to the rim of the supporting frame, possible stresses applied to the circuit board when the runner and gate are cut away are eliminated to thereby ensure reliability. When a large amount of heat is produced in the chip in its operation and high heat dissipation is required, the extended parts of the tabs act as heat radiators to increase the cooling efficiency of the device. The rims 6 of the lead frame may be used as heat radiators without being cut away.

Figure 24A:
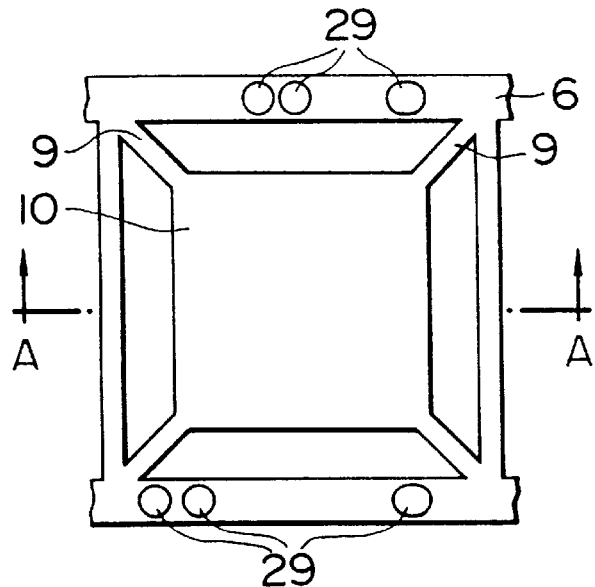
FIG. 24A is a plan view of the supporting frame used in the eighth, ninth, and tenth embodiments.
Figure 24B:
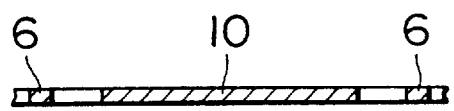
FIG. 24B is a cross-sectional view taken along the line A—A of FIG. 24A.
Figure 25A:
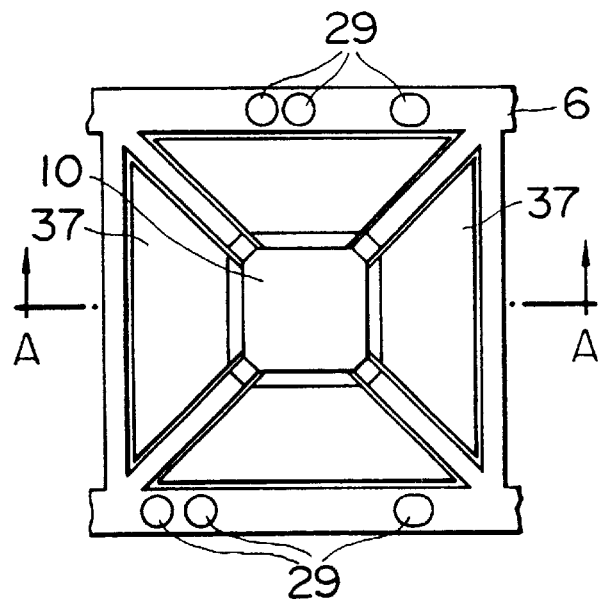
FIG. 25A is a plan view of the supporting frame used in the eleventh-thirteenth embodiments.
Figure 25B:
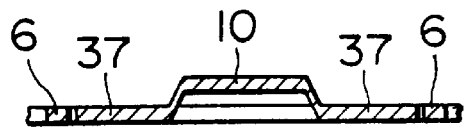
FIG. 25B is a cross-sectional view taken along the line A—A of FIG. 25A.

FIGS. 24 and 25 show the pattern of the stamped-out supporting frame used in the eighth-thirteenth embodiments. FIG. 24A is a plan view of the supporting frame of the eighth-tenth embodiments and FIG. 24B is a cross-sectional view taken along the line A—A of FIG. 24A. The rim 6 of the lead frame and the tab 10 are connected by the four tab supporting parts 9 of the lead frame. FIG. 25A is a plan view of the supporting frame of the eleventh-thirteenth embodiments and FIG. 25B is a cross-sectional view taken along the line A—A of FIG. 24A. The rim 6 of the lead frame and the tab 10 are connected by the four tab supporting part 9 of the lead frame with the four extended parts 37 of the tab projecting from the four sides of the tab 10. The extended parts 37 of the tab and the tab supporting parts 9 of the lead frame are bent such that all the terminals 39 on the extended parts 38 of the circuit film are flush (or at the same height). While the respective elements concerned are described as connected at four points, the number of connection leads may be increased/decreased as required. The supporting frames of FIGS. 24 and 25 each may be made, for example, of a Fe—Ni alloy, a Cu alloy or other metal material. The rims 6 of the lead frames of FIGS. 24 and 25 have guide holes 29 through the respective elements concerned so as to be positioned in the respective manufacturing process.

The requisites for molding the first-third, eighth, ninth, eleventh and twelfth embodiments are (1) to avoid the formation of a bad appearance having air voids therein; and (2) to avoid production of resin burrs on the terminal surfaces on the circuit board when bumps are joined. The state of the resin filled onto the respective embodiments when molded will be described with reference to FIGS. 43 and 44 diagrammatically in order to illustrate the course of production of air voids and a process for preventing the production of the voids in the above requisite (1).

Figure 43A:
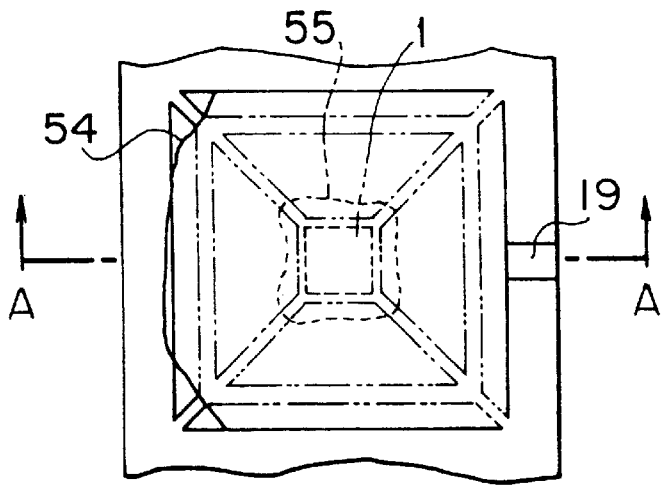
FIGS. 43A and 43C each are a schematic plan view of a package under resin filling.
Figure 43B:
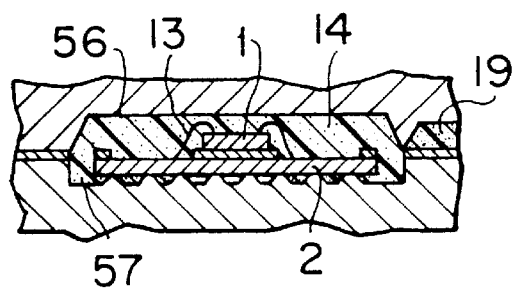
FIGS. 43B and 43D are cross-sectional views taken along the lines A—A and B—B of FIGS. 43A and 43C, respectively.
Figure 43C:
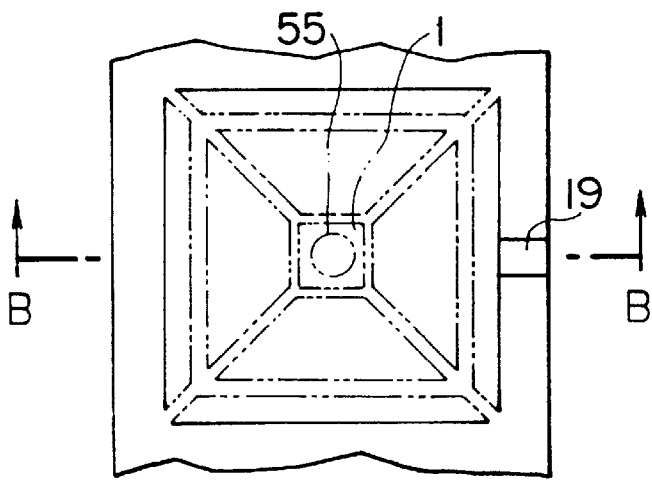
Figure 43D:
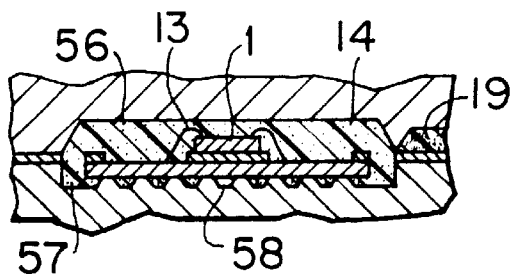

FIGS. 43A, 43B, 43C, 43D each diagrammatically illustrate a filled resin in the molding. FIGS. 43A and 43C each are a plan view. FIGS. 43B and 43D each are a cross-sectional view taken along the lines A—A and B—B of FIGS. 43A and 43C, respectively. FIGS. 43A and 43B show the process of resin 14 filling a cavity after passage through a gate 19. The solid line indicates the front of a flowing resin 54 in an upper cavity half while the broken line indicates the front 55 of a flowing resin in a lower cavity half at the same point in time. As will be understood from FIG. 43B which is the cross-sectional view of FIG. 43A, the resin path in the upper cavity half 56 is far less complicated than that in the lower cavity half 57 such that the filling of resin in the upper cavity half 56 completes much earlier than in the lower cavity 57. FIGS. 43C, 43D show a later state of the resin filled. After the upper cavity half 56 is filled with resin, the filling of resin advances from the four sides of the lower cavity half 57 toward its center. Therefore, as shown in the cross-sectional view of FIG. 43D taken along the line B—B of FIG. 43C, air voids 58 in the lower cavity half 57 have no escape paths and are confined within the cavity.

Figure 44A:
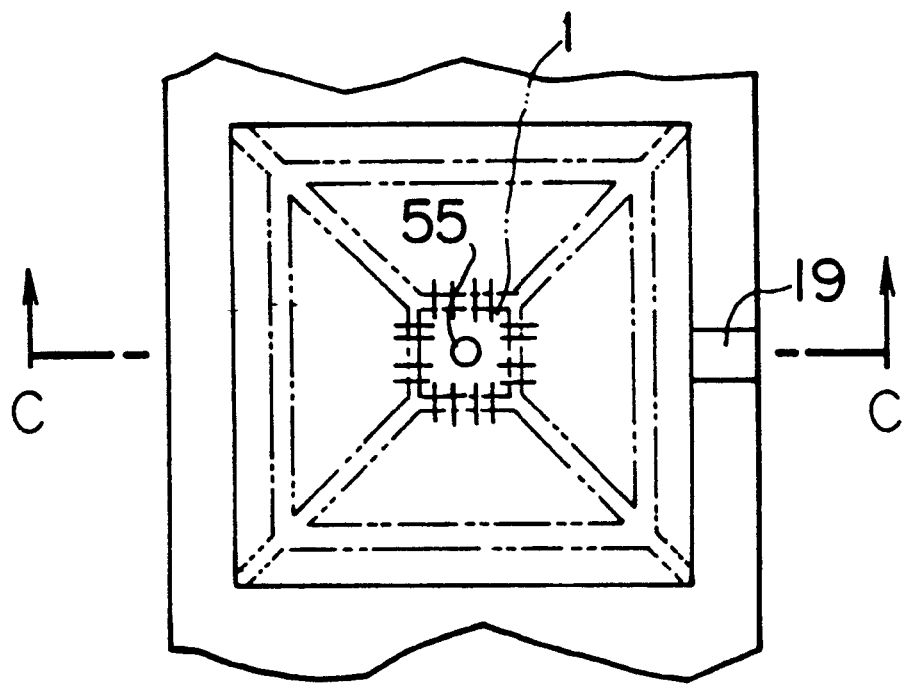
FIGS. 44A and 44B are a schematic plan view of a PGA package when the resin filling process has ended and a cross-sectional view taken along the line C—C of FIG. 44A, respectively.
Figure 44B:
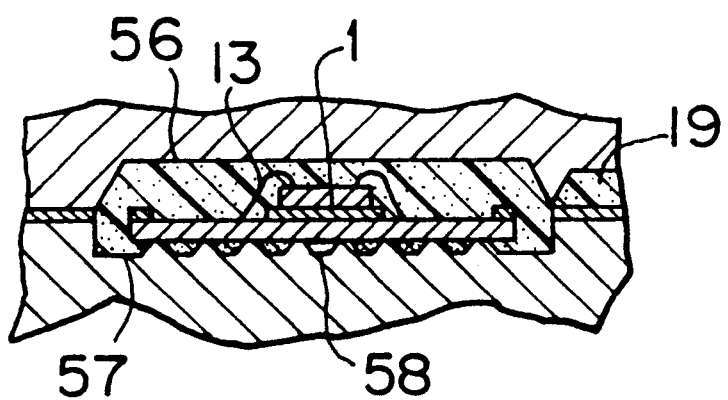

FIG. 44 shows the completion of resin filling for the BGA package. FIG. 44A is a plan view and FIG. 44B is a cross-sectional view taken along the line C—C of FIG. 44A. Air voids 58 are confined within an upper portion of the lower cavity half 57. Thus, the molding is bad. In order to avoid this situation, a mold structure which avoids the void 58 will be described with reference to FIGS. 45 and 46.

Figure 45A:
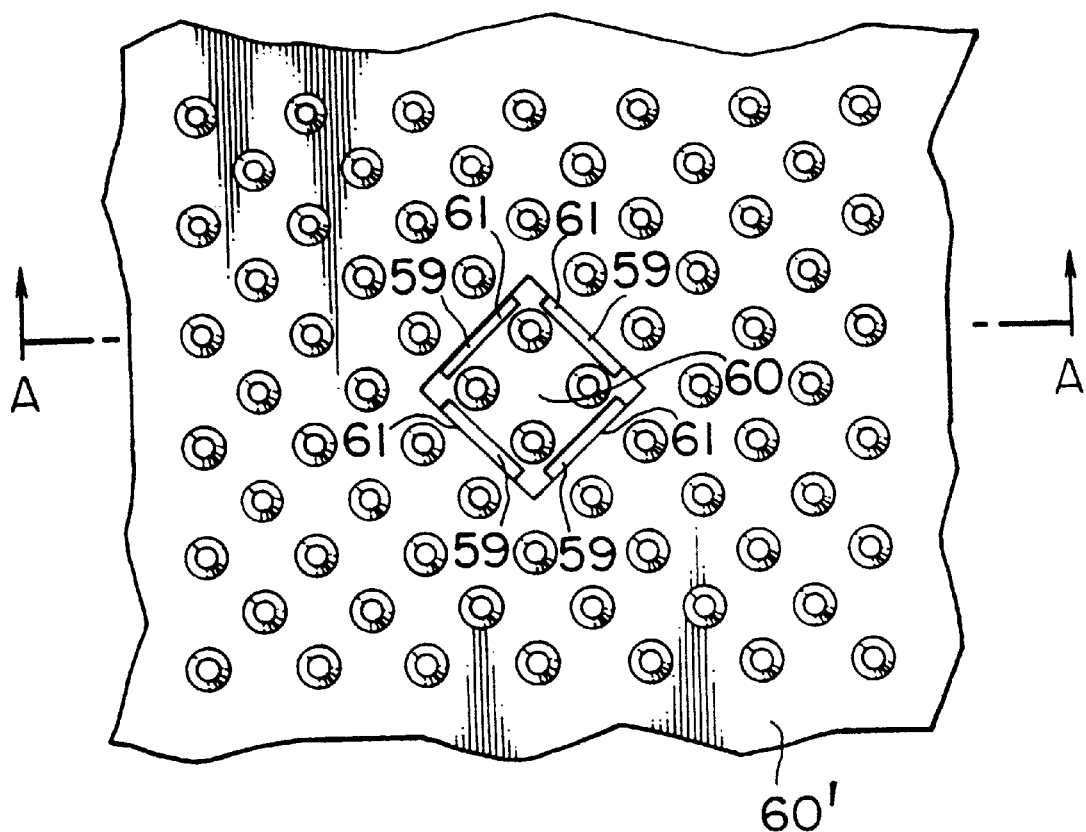
FIGS. 45A and 45B are an enlarged plan view of the central portion of a lower mold cavity half of a fourteenth embodiment of the present invention and an enlarged cross-sectional view taken along the line A—A of FIG. 44A, respectively.
Figure 45B:
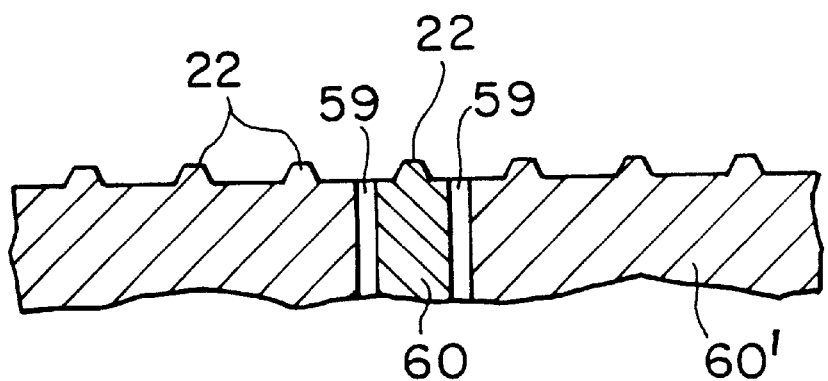

FIG. 45 shows a fourteenth embodiment. FIG. 45A is an enlarged plan view of the central portion of the lower cavity half 57 and FIG. 45B is a cross-sectional view taken along the line A—A of FIG. 45A. The lower mold half is divided into a plurality of sections, one being interlocked with another section, to form air paths or vents 59 to allow possible air voids to escape therethrough. In this example, the lower cavity half 57 is divided into two sections; that is, a first section 60 which has projections 22 which are of the same shape as the other projections, and air vents 59 provided along the periphery of the first section and a second section 60' which receives the first section 60 such that the air voids are allowed to escape from the air vents 59 in the boundary 61 between the first and second sections through the wall of the lower cavity half 57. The section 60 also functions as a projection pin which slides out when a molded product 23 is removed from the mold.

Figure 46A:
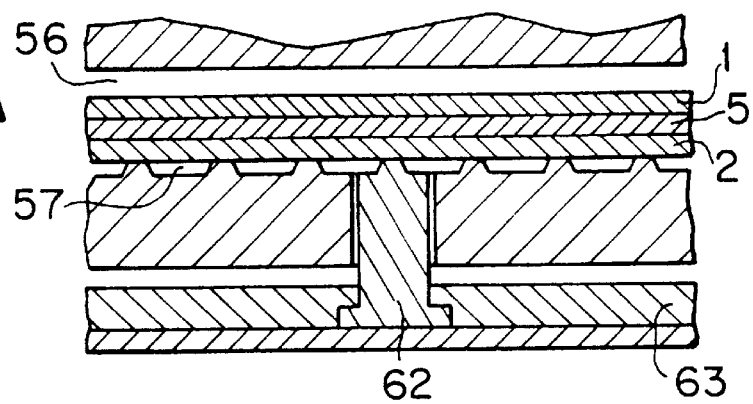
FIGS. 46A, 46B and 46C each show an operational state of the central portion of a mold cavity in the fourteenth embodiment.
Figure 46B:
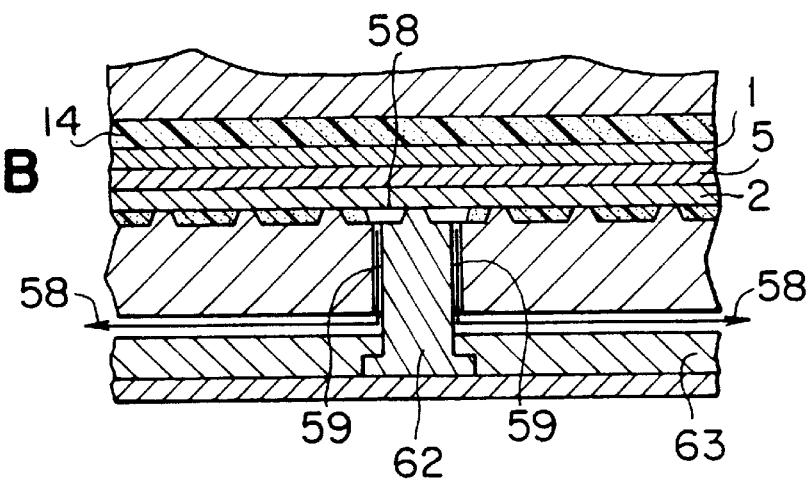
Figure 46C:
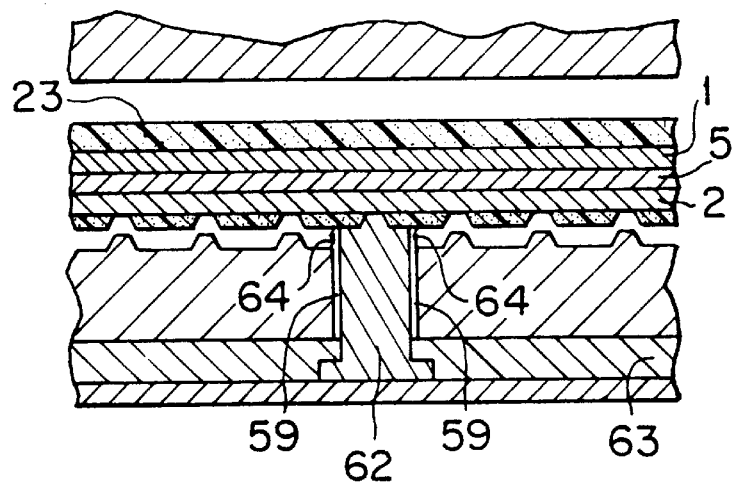

The sliding operation of the sections 60, 60' will be described with reference to FIG. 46. FIG. 46A is an enlarged cross-sectional view of the central portion of a cavity where the supporting frame 5, circuit board 2 and IC chip 1 such as those of the first embodiment are set. The section 60 functions as a projection pin 62 fixed to a projection pin fixing plate 63 of the mold. FIG. 46B shows the step of filling the resin 14. The confined air voids 58 flow downward through the air vents 59 and then go out in the direction of horizontal arrows 58 through the spacing between the section 69' and the pin fixing plate 63. FIG. 46C illustrates removal of a molded product from the mold after the filled resin 14 is heated and cured. The projection pin 62 is slid out by the movement of the projection pin fixing plate 63 to allow the molded product 23 to be removed from the mold. By this sliding operation, possible resin burrs 64 adhering to the air vents 59 are separated such that the mold is put in a normal state for the next process. While the use of the two-sectioned lower cavity half has been described above, the lower cavity half may be divided into more than two sections as requested, of course. While the projection pin is illustrated as taking the form of a rod of a square cross section, it may take another form such as a rectangular or circular cross section. In order to facilitate the removal of resin burrs, surface treatment such as poly 4-fluoride ethylene coating may be performed, of course.

As described above, by the use of a lower cavity half consisting of a plurality of sections with air vents each between adjacent sections, air voids are eliminated. In addition, automatic elimination of possible resin burrs adhering to the air vent is achieved by the sliding function of the projection pin to thereby facilitate the automation of the molding process.

The course of production of resin burrs on the surfaces of the terminals on the board and a method of preventing the production of such resin burrs as the above-mentioned subject (2) will be described next. The course of production of the resin burs will be described with reference to FIG. 47.

Figure 47A:
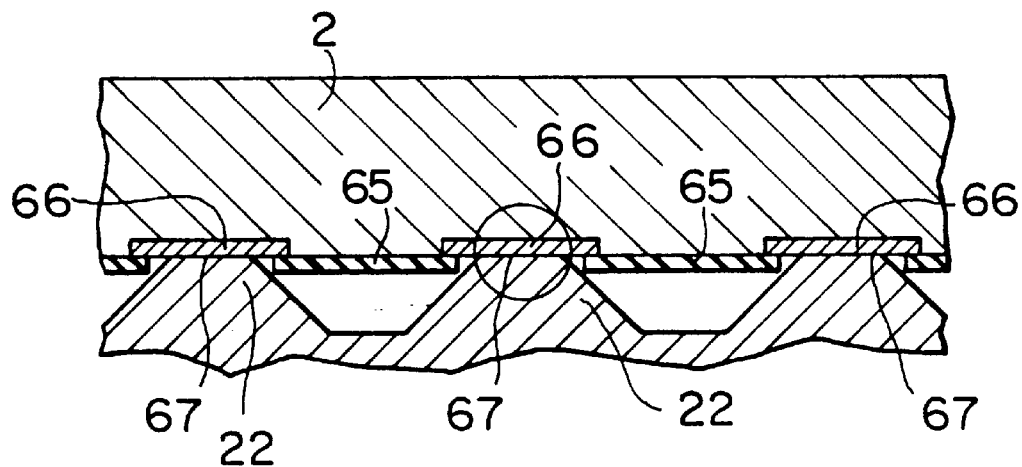
FIG. 47A is a cross-sectional view of circuit board terminals and related projections of a lower mold cavity half.
Figure 47B:
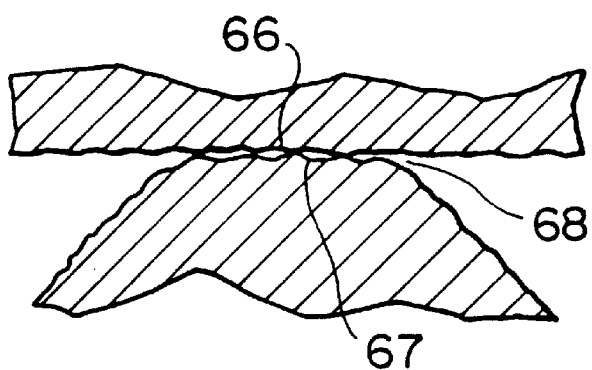
FIG. 47B is an enlarged cross-sectional view of a part of FIG. 47A.
Figure 47C:
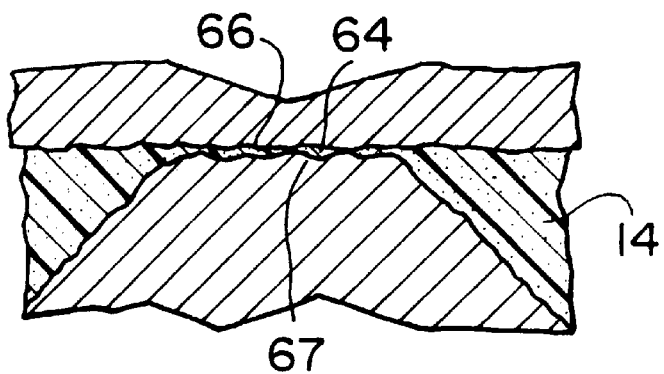
FIG. 47C illustrates resin filling between the engaged elements of FIG. 47B.

FIG. 47A is an enlarged cross-sectional view where the board terminals are placed in contact with the projections of the lower mold cavity half. The areas around the terminals 3 on the board 2 and their nearby wiring leads (not shown) are covered with an insulating material 65. In the cavity, the surfaces 66 of the terminals on the circuit board 2 are placed in contact with the tops 67 of the projections 22 in the lower mold cavity half, that is, solid surfaces are placed in contact with each other. FIG. 47B is an enlarged diagrammatic view of an encircled portion of FIG. 47A. That is, substantially a rugged surface 66 of a terminal is placed in contact with a rugged top surface 67 of a projection 22 with a spacing 68 being formed there-between. When resin molding is performed in this state, resin 14 is forced into the spacing 68 to become resin burrs 64, which will remain on the terminal surface 66, as shown in FIG. 47C. In addition, when the board itself is considered, the production of further resin burrs due to a bend and deformation of the board itself or variation in the board thickness is possible. In order to prevent the production of such resin burrs, a method of forcedly pressing the board against the projections of the lower mold cavity half is usable. However, the use of this method may damage the board in dependence on the magnitude of the pressing force. Thus, the present invention employs another method, which will be described as a fifteenth embodiment with reference to FIGS. 48–51 below.

The fifteenth embodiment will first be described with reference to FIGS. 48 and 49. FIG. 48 diagrammatically shows an enlarged cross section of board terminals and projections to thereby illustrate a process for preventing the occurrence of resin burrs. FIG. 48(a) shows mold releasing agents 70 coated on the tops of dummy projections disposed 69 in the same arrangement as the terminals 3 on the board 2. The mold releasing agent preferably is, for example, a silicon resin or a solvent in which poly 4-fluoride ethylene resins are dispersed or a wax resin which is liquid in the vicinity of the molding temperature. As shown in FIG. 48(b), the circuit board 2 is placed on the dummy projections 69, and the mold releasing agents 70 are transferred onto the terminal surfaces 66 on the board 2 to form a board 71 with a mold releasing agent, as shown in FIG. 48(c).

Figure 49:
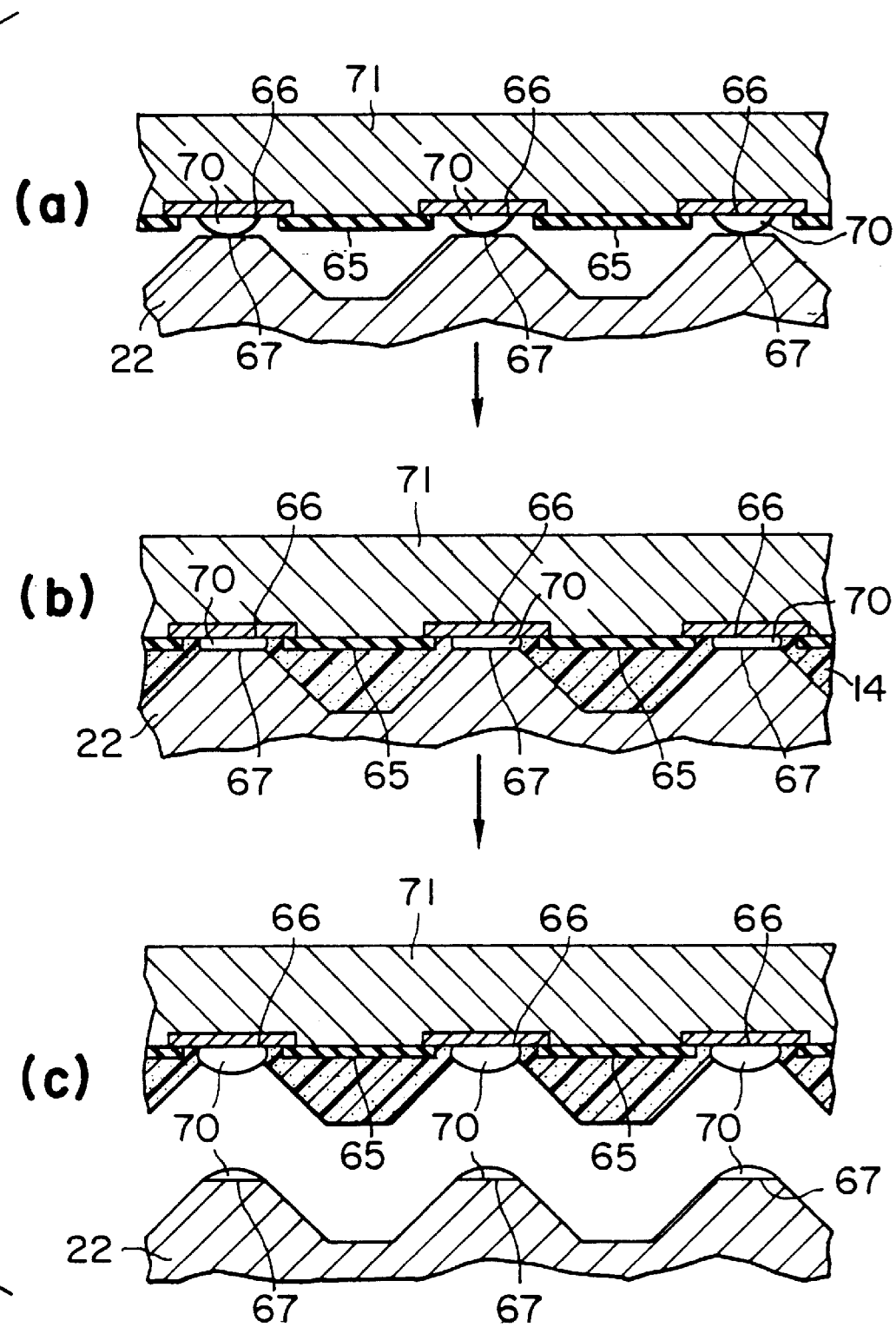
FIGS. 49a–49c is a flowchart indicative of a process for molding a board with mold releasing agents.

FIG. 49 shows a process for molding a PGA package, using a board 71 with a mold releasing agent disposed thereon. In FIG. 49(a), the terminal surfaces 66 on a board 71 are placed in contact with the tops 67 of the projections 22 of the lower cavity half through mold releasing agents 70. FIG. 49(b) shows resin molding. The terminal surfaces 66 on the board 2 are placed in close contact with the projections 22 of the lower mold cavity half through the mold releasing agents 70 to thereby eliminate a possible spacing between the surfaces 66 and the projections 22 and hence prevent the production of resin burrs. FIG. 49C shows the state of the molded board after resin molding ends. The terminal surfaces 66 on the board 2 and the tops 67 of the lower cavity half have the remaining mold releasing agents 70 thereon. After the mold releasing agents have been eliminated, external terminals such as bumps are formed on the terminal surfaces 66 on the board 2.

A sixteenth embodiment will be described with reference to FIGS. 50 and 51. FIG. 50 diagrammatically shows a cross section of the board terminals and projections and illustrates a process for preventing the production of resin burrs. FIG. 50(a) shows terminals 3 on the board 2 disposed in the same arrangement as the projections 22 in the lower mold cavity half and coated with thermosetting rubber resins 72. The thermosetting rubber resins may preferably include, for example, a silicon resin or poly 4-fluoride ethylene resin. As shown in FIG. 50(b), the board 3 is placed on the projections 22 of the lower mold cavity half to transfer the rubber resins to the projections 22, as shown in FIG. 50(c). Thereafter, the rubber resins are cured under predetermined curing conditions.

FIG. 51 shows a process for molding a package, using the projections 22 of the lower mold cavity half with cured rubber resins. In FIG. 51(a), the terminal surfaces 66 of the board 2 and the projections 22 of the lower mold cavity half are placed in contact with each other through the cured rubber resins 73. FIG. 51B shows resin molding. As described above with reference to FIGS. 43 and 44, the upper mold cavity half is filled with resin earlier than the lower mold cavity half, so that the board 2 is pressed against the projections 22 of the lower mold cavity half and the cured rubber resins 73 between the terminal surfaces 66 and the projections 22 are elastically deformed, which causes the terminal surfaces 66 and the tops of the projections 22 to be placed in close contact with each other so as not to provide spacings therebetween to thereby prevent production of resin burrs. FIG. 51C shows the completion of the molded device. When the elastically deformed cured rubber resins 73 are recovered in its original form when the molded product 23 is removed from the mold in preparation for the next molding process. Thereafter, external terminals such as bumps or the like are formed on the terminal surfaces 66 of the board 2.

Figure 52:
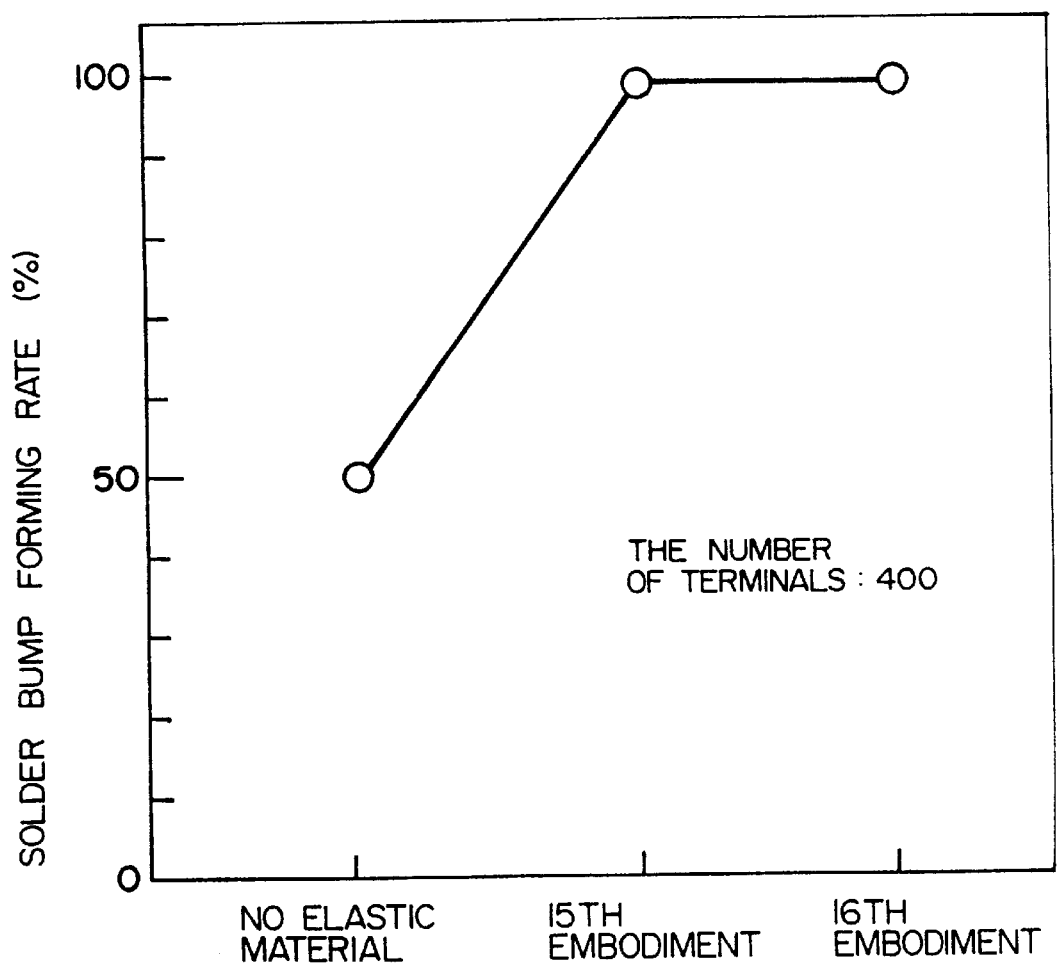
FIG. 52 is a diagram indicative of solder bump formation rates plotted for the respective embodiments.

FIG. 52 shows one example of the rate of forming solder bumps indicative of the resin bur preventing effect. In this case, 400 terminals were used as an example. It will be seen that when there are no elastic materials between the board terminal surfaces and the mold projections, the solder bump forming rate is about 50%. In contrast, it will be seen that in the fifteenth and sixteenth embodiments where elastic materials are provided between the mold projections and the board terminal surfaces, the solder bump forming rate is substantially 100%.

Thus, according to the arrangements of the fifteenth and sixteenth embodiments, provision of an elastic material between the terminal surfaces on the board and the mold projections serves to eliminate a bend and variation in the thickness of the circuit board and increases the degree of close contact between both the terminal surfaces and the mold projections to thereby prevent the production of resin burrs. While in the description the use of the mold releasing agent and the cured rubber resin have been explained, of course, any elastic material which will be deformed at the molding temperature may produce similar advantages.

According to the present invention, an increase in the productivity and cost reduction are achieved easily by using the supporting frame. By resin sealing of BGA elements, the moisture-proof reliability is greatly increased. The formation of a package with many terminals disposed over as well as outside the chip as in the eleventh-thirteenth embodiments is easily achieved by modifying the shape of a tab in the supporting frame structure to an extended one. The use of the supporting frame and employment of a conventional molding technique facilitate the automation of the molding process and saving of attendants to thereby improve the productivity and ensure stabilized production.

The use of a mold structure which prevents the production of air voids in the resin molding and resin burs on the board terminal surface in the resin molding improves the productivity and ensures stabilized production.

What is claimed is:

1. A method of manufacturing a semiconductor device, comprising the steps of:
    bonding a base member to a frame, said base member having a circuit wiring;
    electrically connecting a semiconductor chip and said base member having a circuit wiring; and
    resin-sealing said semiconductor chip using a mold, wherein in said step of resin-sealing, said semiconductor chip is positioned in place within said mold using said frame and is then resin-sealed.

2. The method according to claim 1, further comprising the step of forming semiconductor bumps on said resin-sealed semiconductor chip.

3. The method according to claim 1, wherein said base member includes an insulating base member and wiring patterns formed on both surfaces of said insulating base member, said wiring patterns on said both surface of said insulating member are electrically connected to each other, on one surface of said base member is mounted said semiconductor chip and on the opposite surface to the one on which said semiconductor chip is mounted is formed said bumps.

4. The manufacturing method according to claim 1, wherein said frame supports a plurality of semiconductor chips.

5. The manufacturing method according to claim 1, further comprising the step of separating individual semiconductor chips from said frame supporting said plurality of semiconductor chips.

6. The manufacturing method according to claim 4, wherein in said processing of resin-sealing, said plurality of semiconductor chips secured to said frame are transfer molded.

7. The method according to claim 1, wherein said frame is made of a material including a Fe—Ni alloy.

8. The method according to claim 1, wherein said frame is made of a material including a Cu alloy.

9. The method according to claim 1, wherein in said step of electrically connecting said semiconductor chip and said base member, said semiconductor chip and said base member are connected by a wire bonding, and no electrical connection is made between said frame and said semiconductor chip and between said frame and said base member.

10. A method of manufacturing a semiconductor device, comprising the step of:
    bonding a plurality of semiconductor chips and a base member to a frame, said base member having a circuit wiring;
    electrically connecting said semiconductor chips and said base member having a circuit wiring; and
    resin-sealing said semiconductor chips using a mold, wherein in said step of resin-sealing, said plurality of semiconductor chips are positioned in place within said mold using said frame and are then resin-sealed.

11. The method according to claim 10, further comprising the step of forming semiconductor bumps on said resin-sealed semiconductor chips.

12. The method according to claim 10, wherein said base member includes an insulating base member and wiring patterns formed on both surfaces of said insulating base member, said wiring patterns on said both surfaces of said insulating member are electrically connected to each other, and on one surface of said base member is mounted said fist semiconductor chips and on the opposite surface to the one on which said semiconductor chips are mounted are formed said bumps.

13. The manufacturing method according to claim 10, further comprising the step of separating individual semiconductor chips from said frame supporting said plurality of semiconductor chips.

14. The manufacturing method according to claim 10, wherein in said process of resin-sealing, said plurality of semiconductor chips secured to said frame are transfer molded.

15. The method according to claim 10, wherein said step of electrically connecting said semiconductor chips and said base member, said semiconductor chips and said base member are connected by a wire bonding, and no electrical connection is made between said frame and said semiconductor chips and between said frame and said base member.

16. The method according to claim 1, wherein said base member is a multi-layered circuit board.

17. The method according to claim 1, wherein said base member is a circuit film.

18. A method of manufacturing a semiconductor device, comprising the steps of:

bonding a semiconductor chip and a base member to a frame, said base member having a circuit wiring;

electrically connecting a semiconductor chip and said base member having a circuit wiring;

resin-sealing said semiconductor chip; and forming solder bumps on said resin-sealed semiconductor chip.

19. The method according to claim 18, wherein in said step of resin sealing, said frame is positioned in place using a mold and guiding holes provided in said frame and is then resin-sealed.

20. The method according to claim 18, wherein in said step of resin-sealing, said frame having a plurality of semiconductor chips secured thereto is disposed within said mold and a plurality of semiconductor chips are resin-sealed in subsets of equal number.

21. A method of manufacturing a semiconductor device, comprising the steps of:

mounting a semiconductor chip on a base member having a circuit wiring;

electrically connecting said semiconductor chip and said base member having a wiring;

bonding said base member having a wiring to a frame;

resin-sealing said semiconductor chip; and forming solder bumps on said resin-sealed semiconductor chip.

22. A method of manufacturing a semiconductor device, comprising the steps of:

bonding a base member having a circuit wiring to a frame;

mounting a semiconductor chip on said base member having a circuit wiring;

electrically connecting said semiconductor chip and said base member having a circuit wiring;

resin-sealing said semiconductor chip; and forming solder bumps on said resin-sealed semiconductor chip.

* * * * *

UNITED STATES PATENT AND TRADEMARK OFFICE
CERTIFICATE OF CORRECTION

| | | |
|---|---|---|
| PATENT NO. | : 6,686,226 B1 | |
| APPLICATION NO. | : 09/562758 | |
| DATED | : February 3, 2004 | |
| INVENTOR(S) | : S. Tsunoda et al. | |

It is certified that error appears in the above-identified patent and that said Letters Patent is hereby corrected as shown below:

ON THE TITLE PAGE:

Please correct (73) Assignee to read as follows:

(73) Renesas Technology Corp., Tokyo (JP)

Signed and Sealed this

Twenty-first Day of November, 2006

JON W. DUDAS
*Director of the United States Patent and Trademark Office*